United States Patent [19]
Nakamura

[11] Patent Number: 6,015,994
[45] Date of Patent: Jan. 18, 2000

[54] SEMICONDUCTOR MEMORY DEVICE AND MANUFACTURING METHOD THEREOF

[75] Inventor: Mitsuyoshi Nakamura, Hyogo, Japan

[73] Assignee: Mitsubishi Denki Kabushiki Kaisha, Tokyo, Japan

[21] Appl. No.: 08/417,333

[22] Filed: Apr. 5, 1995

[30] Foreign Application Priority Data

Apr. 6, 1994 [JP] Japan .................................. 6-068725

[51] Int. Cl.$^7$ ........................... H01L 29/76; H01L 29/94; H01L 31/062; H01L 31/113
[52] U.S. Cl. ............................................................ 257/380
[58] Field of Search ............................................. 257/38 C

[56] References Cited

U.S. PATENT DOCUMENTS 4,592,128  6/1986  Bourassa ................................. 257/380
5,049,970  9/1991  Tanaka et al. ........................... 257/380

FOREIGN PATENT DOCUMENTS 61-6856  1/1986  Japan .
5-206409  8/1993  Japan .

OTHER PUBLICATIONS

Muller et al, *Device Electronics for ICS*, pp. 454–455, 1986.

*Primary Examiner*—Stephen D. Meier
*Attorney, Agent, or Firm*—McDermott, Will & Emery

[57] ABSTRACT

A semiconductor memory device and a manufacturing method thereof are disclosed in which a reduction of the number of steps is made possible between the step of writing into ROM and the completion of the semiconductor memory device. In this semiconductor memory device, a high resistance polycrystalline silicon wiring region is provided at a portion of a source wiring connected to a source region of an MOS transistor. Accordingly, the MOS transistor can be turned OFF easily when a voltage of 3 V to 5 V is applied to that MOS transistor, without having to control its threshold voltage. In addition, if the manufacturing process for forming the high resistance wiring region in the source region is performed after the formation of a contact hole for an aluminum wiring for drains, the number of process steps is reduced between the step of writing into the ROM and completing the semiconductor memory device.

11 Claims, 21 Drawing Sheets

SEMICONDUCTOR MEMORY DEVICE AND MANUFACTURING METHOD THEREOF

BACKGROUND OF THE INVENTION

1. Field of the Invention

The present invention relates to a semiconductor memory device and a manufacturing method thereof, and particularly to a semiconductor memory device and a manufacturing method thereof in which a single memory cell consists of a single field effect transistor.

2. Description of the Background Art

Conventionally, a semiconductor memory device is known which includes an ROM (Read Only Memory). FIG. 24 is an equivalent circuit diagram of a conventional semiconductor memory device including an ROM. Referring to FIG. 24, a single memory cell of the ROM is constituted of a single enhancement type MOS (Metal Oxide Semiconductor) transistor. MOS transistors 201 and 203 have their gate electrodes connected to a gate electrode (wiring) 104a, MOS transistors 202 and 204 have their gate electrodes connected to a gate electrode (wiring) 104b, MOS transistors 205 and 207 have their gate electrodes connected to a gate electrode (wiring) 104c, and MOS transistors 206 and 208 have their gate electrodes connected to a gate electrode (wiring) 104d, respectively. Source regions of MOS transistors 201 to 208 are connected to an aluminum wiring 110a for the sources, while drain regions are connected to an aluminum wiring 110b for the drains.

When reading is performed with supply voltage $V_{DD}$ set at 3 V to 5 V, MOS transistor 201 will have its threshold voltage $V_{TH}$ set at 0.5 to 1.0 V and MOS transistor 202 will have its threshold voltage $V_{TH}$ set at 5.0 V or more. Thus, when supply voltage $V_{DD}$=3 V to 5 V, MOS transistor 201 would be turned ON and MOS transistor 202 would be turned OFF. As a result, data "1" can be read from MOS transistor 201 and data "0" from MOS transistor 202, or data "0" can be read from MOS transistor 201 and data "1" from MOS transistor 202. In the semiconductor device of FIG. 24, threshold voltages $V_{TH}$ of MOS transistors 203 to 208 are all set between 0.5 V and 1.0 V.

FIG. 25 is a plan view of the semiconductor memory device shown in FIG. 24. Referring to FIG. 25, region 300 of FIG. 24 corresponds to region 300 of FIG. 25. Aluminum wirings 110a for the sources are connected to the source regions (not shown) via source contact holes 113. Aluminum wirings 110b for the drains are connected to the drain regions (not shown) via drain contact holes 112. At predetermined regions under aluminum wirings 110a for the sources, element isolating regions 122 are formed.

FIG. 26 is a cross sectional view of the semiconductor device shown in FIG. 25, taken along line 400—400 of FIG. 25. Referring to FIG. 26, N type high impurity concentration regions 107a and 107b are formed on a main surface of a silicon substrate 101, spaced apart by a predetermined distance with channel region therebetween. At the end portions of N type high impurity concentration regions 107a and 107b adjacent to gate electrode 104a, N type low impurity concentration regions 105a and 105b are formed, respectively. N type high impurity concentration region 107a and N type low impurity concentration region 105a constitute the source region with an LDD (Lightly Doped Drain) structure. N type high impurity concentration region 107b and N type low impurity concentration region 105b constitute the drain region having an LDD structure which is shared by MOS transistors 201 and 202.

Gate electrode 104a is formed on the channel region of MOS transistor 201 through a gate oxide film 102a. Gate electrode wiring 104b is formed on the channel region of MOS transistor 202 through gate oxide film 102b. Thickness of gate oxide films 102a and 102b is about 150 Å to about 250 Å. Gate electrodes 104a and 104b consist of doped polycrystalline silicon layer, and their thickness is about 1000 Å to about 3000 Å. On the side surfaces of gate electrodes 104a and 104b, sidewall insulating films 106 are formed.

In addition, an interlayer insulating film 109 having a thickness of about 10000 Å is formed entirely on the surface. Drain contact hole 112 is formed at a region in interlayer insulating film 109 located on N type high impurity concentration region 107b. Aluminum wiring 110b having a thickness of about 7000 Å to about 100000 Å is formed so that it is electrically in contact with N type high impurity concentration region 107b within drain contact hole 112 while extending along the surface of interlayer insulating film 109. A passivation film 111 having a thickness of about 7000 Å to about 8000 Å is formed on aluminum wiring 110b.

In a conventional semiconductor memory device, threshold voltage $V_{TH}$ of MOS transistor 202 is set at 5.0 V or more by forming a high concentration channel doped region 108 at the channel region of MOS transistor 202. Since no high concentration channel doped region 108 is formed at the channel region of MOS transistor 201, threshold voltage $V_{TH}$ of MOS transistor 201 is about 0.5 V to about 1.0 V.

FIGS. 27 to 36 are cross sectional views illustrating a process of manufacturing the semiconductor memory device shown in FIG. 26. Referring to FIGS. 27 to 36, manufacturing process of the conventional semiconductor memory device will be described in the following.

As shown in FIG. 27, an oxide film 124 having a thickness of about 100 Å to about 500 Å is formed first on the main surface of silicon substrate 101 by thermal oxidation. Then, a channel doped layer 103 is formed by ion implantation of B or $BF_2$ to silicon substrate 101 through oxide film 124.

Thereafter, oxide film 124 is removed, and a gate oxide film 102 as shown in FIG. 28 with a thickness of about 150 Å to about 250 Å is formed on silicon substrate 101. On gate oxide film 102, a doped polycrystalline silicon layer 104 with a thickness of about 1000 Å to about 3000 Å is formed by CVD method (Chemical Vapor Deposition) method. By patterning doped polycrystalline silicon layer 104 through photolithography and dry etching, gate electrodes 104a and 104b as shown in FIG. 29 are formed.

Thereafter, as shown in FIG. 30, gate electrodes 104a and 104b are used as a mask for an ion implantation of phosphorus (P) to silicon substrate 101, thereby forming N type low impurity concentration regions 105a and 105b. Then, an oxide film (not shown) having a thickness of about 2000 Å to 3000 Å is formed entirely over the surface by CVD method and is etched anisotropically to form sidewall insulating films 106 as shown in FIG. 31. Using sidewall insulating films 106 and gate electrodes 104a, 104b as a mask, ion implantation of arsenic (As) is performed to silicon substrate 101 thereby forming N type high impurity concentration regions 107a and 107b.

As shown in FIG. 32, a resist pattern 125 having an opening above gate electrode 104b is formed by photolithography. Resist pattern 125 is used as a mask to preform an ion implantation of a P type impurity (for example, boron) to silicon substrate 101 through gate electrode 104b and gate oxide film 102b. This ion implantation is performed with an implanting energy of 150 KeV to 250 KeV and impurity concentration of $1\times10^{13}$ to $1\times10^{14}$ cm$^{-2}$. Thus, high concentration channel doped region 108 is formed at the channel region of enhancement type MOS transistor 202. As a result, only enhancement type MOS transistor 202 can have its threshold voltage $V_{TH}$ set at 5.0 V or more. Resist pattern 125 is then removed. By heat treatment, N type low impurity concentration regions 105a and 105b as well as N type high impurity concentration regions 107a and 107b are formed to have such shapes as shown in FIG. 33.

Then, as shown in FIG. 34, interlayer insulating film 109 with a thickness of about 10000 Å is formed by CVD method entirely over the surface. A resist pattern 126 is formed on interlayer insulating film 109 by photolithography. Using resist pattern 126 as a mask, interlayer insulating film 109 is subjected to isotropical etching followed by anisotropical etching. By effecting heat treatment after resist pattern 126 is removed, drain contact hole 112 having such a shape as shown in FIG. 35 is formed.

Then, as shown in FIG. 36, aluminum wiring 110b is formed such that it is in contact with N type high impurity concentration region 107b within drain contact hole 112 and extends along the surface of interlayer insulating film 109. Aluminum wiring 110b is formed to have a thickness of about 7000 Å to about 10000 Å by sputtering method.

Finally, as shown in FIG. 26, passivation film 111 having a thickness of about 7000 Å to about 8000 Å is formed entirely over the surface by CVD method. Thus, the conventional semiconductor memory device including an ROM is completed.

In the conventional semiconductor memory device including an ROM, writing into the ROM (formation of high concentration channel doped region 108) is performed in a process shown in FIG. 32. Accordingly, the steps of effecting heat treatment for activation of an impurity region (see FIG. 33), forming interlayer insulating film 109 (see FIG. 34), forming drain contact hole 112, (see FIG. 35), forming aluminum wiring 110b (see FIG. 36), and forming passivation film 111 (see FIG. 26), are required after the step of writing into the ROM. Therefore, in the conventional semiconductor memory device, many steps are required after writing into the ROM until the semiconductor device is completed. Accordingly, it takes a long period after it was ordered by the user to perform the writing into the ROM and to complete the product.

SUMMARY OF THE INVENTION

One object of the present invention is to provide, in a semiconductor memory device, a structure which can simplify the process between the step of writing data and the completion of the semiconductor device.

Another object of the present invention is to provide, in a semiconductor memory device, a structure which enables data to be written after formation of a drain contact hole.

Still another object of the present invention is to reduce the steps between data writing and completion of the semiconductor device in a method of manufacturing a semiconductor memory device.

A yet another object of the present invention is to write data easily after a drain contact hole is formed, in a method of manufacturing a semiconductor device.

In a semiconductor memory device according to one aspect of the present invention, field effect transistor has its source terminal connected to a source wiring, part of which source wiring having a resistor with a high resistance.

Accordingly, if ion implantation or dry etching is used in the actual manufacturing process to form the resistor having a high resistance on the source wiring, it is easily formed after formation of a drain contact hole. Thus, the manufacturing process between the step of data writing and the completion of the semiconductor memory device is reduced, compared to conventional devices.

In a semiconductor memory device according to another aspect of the present invention, a source region and a drain region is formed on a main surface of a semiconductor substrate, with a channel region therebetween. A source wiring layer is formed such that it would be connected electrically to the source region. The source wiring layer is formed of a single material, and a portion of this layer includes a high resistance region.

In this semiconductor memory device, the source wiring layer consisting of a single silicon material is formed so that a portion of this layer includes a high resistance region. Accordingly, the high resistance region is easily formed in the actual manufacturing process after formation of a drain contact hole if ion implantation and dry etching are used to form the high resistance region in the source wiring layer. Thus, the manufacturing process is simplified between the steps of data writing and completion of the semiconductor memory device, compared to conventional devices.

The semiconductor memory device according to still another aspect of the present invention includes a semiconductor substrate, a source region and a drain region, a gate electrode, and a source wiring layer for source region. The source wiring layer and the source region is electrically disconnected.

Since the source wiring layer and the source region is electrically disconnected in this semiconductor memory device, the source wiring layer is cut easily after the formation of the drain contact hole in the actual manufacturing process, if dry etching is used to cut the source wiring layer. Accordingly, the manufacturing process is simplified between the step of writing data and the completion of the semiconductor memory device, compared to conventional devices.

In a method of manufacturing a semiconductor memory device according to a further aspect of the present invention, a gate electrode is formed on a channel region which is on a main surface of a semiconductor substrate. A source region and a drain region are formed with the channel region therebetween. A source wiring layer made of a single silicon material is formed, which is connected electrically to the source region. After forming an interlayer insulating film covering the source wiring layer, an opening is formed at a region located on a drain region of the interlayer insulating film. By an ion implantation of an impurity to a portion of the source wiring layer through the interlayer insulating film, a high resistance region is formed in the source wiring layer.

In this method of manufacturing the semiconductor device, formation of the interlayer insulating film covering the source wiring layer is followed by the formation of the opening at the region located on the drain region of that interlayer insulating film, and by implanting thereafter an impurity into a portion of the source wiring layer through the interlayer insulating film, a high resistance region is formed at the source wiring layer so that data writing (that is, formation of the high resistance region) is effected in a step that comes later compared to the conventional example in which the data was written immediately after the formation of a field effect transistor. Accordingly, steps are reduced between the step of data writing and completion of the semiconductor memory device.

In a method of manufacturing a semiconductor memory device according to a further aspect of the present invention, a gate electrode, a source region and a drain region, a source wiring region, and a first opening of an interlayer insulating film are formed. On the interlayer insulating film, an etching mask layer is formed. Using the etching mask layer as a mask, the interlayer insulating film is then etched to form a second opening, and by etching the source wiring region within that second opening by a predetermined thickness, a high resistance region is formed at the source wiring region.

In this method of manufacturing the semiconductor memory device, after forming the first opening at the region located on the drain region of the interlayer insulating film, the interlayer insulating film is etched using the etching mask layer on that interlayer insulating film to form the second opening, and the source wiring region within this second opening is etched by a predetermined thickness. Accordingly, the formation of the high resistance region (that is, writing of data) is easily achieved after forming the first opening on the drain region. Thus, the manufacturing process between the steps of writing data and completing the semiconductor memory device is simplified compared to the conventional devices.

In a method of manufacturing a semiconductor memory device according to a further aspect of the present invention, a gate electrode, a source region and a drain region, a source wiring layer and a first opening of an interlayer insulating film are formed. On the interlayer insulating film, an etching mask layer is formed. Using the etching mask layer as a mask, the interlayer insulating film is etched to form a second opening, and the source wiring layer is cut by etching away the source wiring layer in that second opening.

In this method of manufacturing the semiconductor memory device, after forming the first opening at a region located on the drain region of the interlayer insulating film, a second opening is formed at the interlayer insulating film using the etching mask layer on the interlayer insulating film, and the source wiring layer is cut by etching away the source wiring layer in that second opening. Accordingly, cutting of the source wiring region (that is, writing of the data) is easily achieved after the formation of the first opening on the drain region. Thus, the steps are reduced between the step of writing data and completion of the semiconductor memory device.

The foregoing and other objects, features, aspects and advantages of the present invention will become more apparent from the following detailed description of the present invention when taken in conjunction with the accompanying drawings.

DESCRIPTION OF THE PROFFERED EMBODIMENTS

Embodiments of the present invention will now be described, with reference to the figures.

Figure 1:
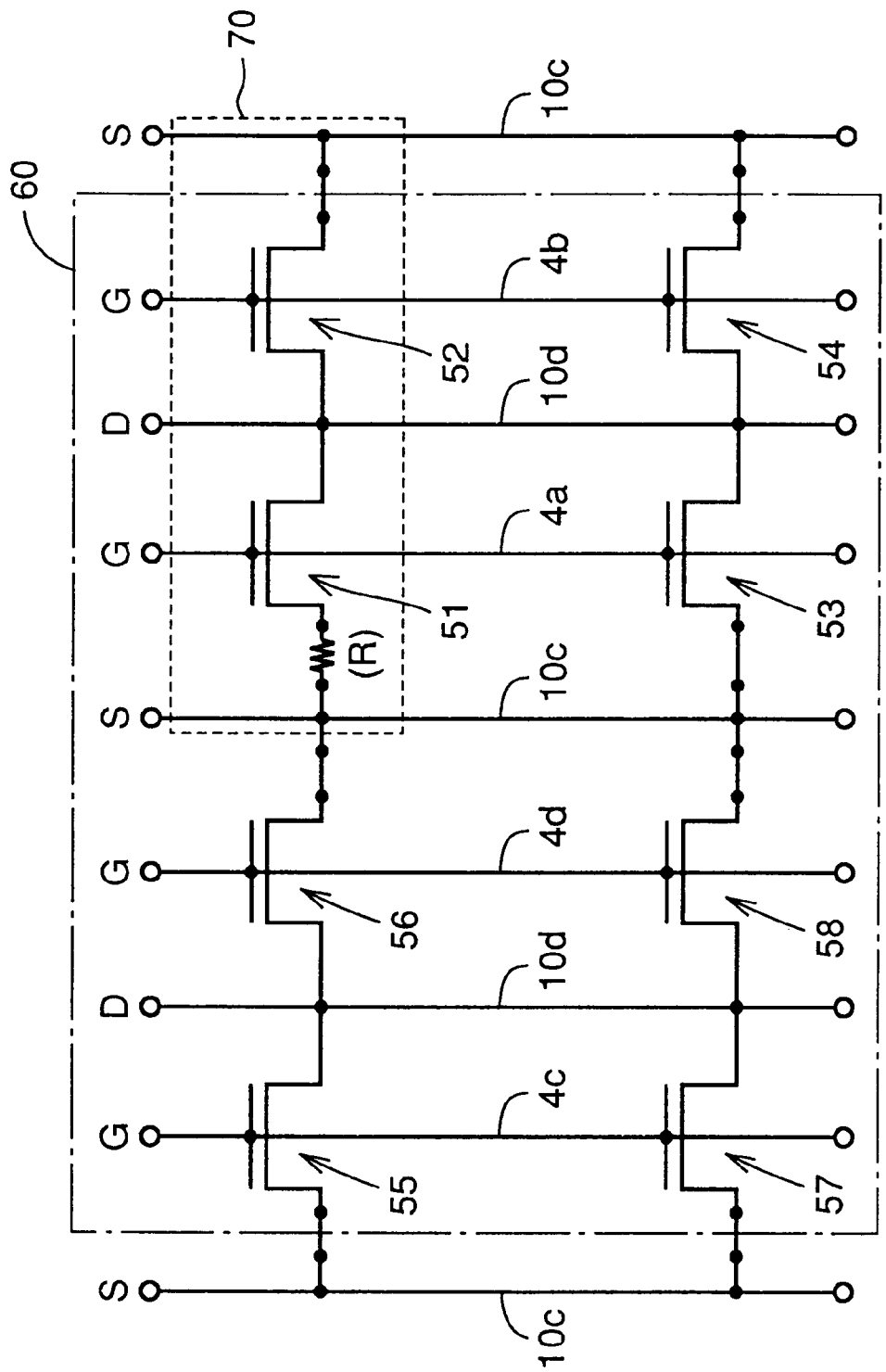
FIG. 1 is an equivalent circuit diagram of a semiconductor memory device including an ROM, in accordance with the first embodiment of the present invention.

Referring first to FIG. 1, in a semiconductor memory device according to a first embodiment of the present invention, eight transistors 51 to 58 are all enhancement type MOS transistors. Threshold voltage $V_{TH}$ of the eight transistors are all set between 0.5 V and 1.0 V. MOS transistors 51 and 53 have their gate electrodes connected to a gate electrode (wiring) 4a, and MOS transistors 52 and 54 have their gate electrodes connected to a gate electrode (wiring) 4b. MOS transistors 55 and 57 have their gate electrodes connected to a gate electrode (wiring) 4c, and MOS transistors 56 and 58 have their gate electrodes connected to a gate electrode (wiring) 4d. MOS transistors 51 to 54 have their drain regions connected to an aluminum wiring 10d for drains, and source regions of MOS transistors 52 and 54 are connected to an aluminum wiring 10c for sources. MOS transistors 55 to 58 have their drain regions connected to an aluminum wiring 10d for drains, and source regions of MOS transistors 55 and 57 are connected to an aluminum wiring 10c for sources. MOS transistors 51, 53, 56, and 58 have their source regions connected to an aluminum wiring 10c for sources.

Here, in this embodiment, a high resistance region (R) having a resistance value of at least 1 Tera $\omega/\square$ is connected to a terminal at the source side of MOS transistor 51 which is to be turned OFF when supply voltage $V_{DD}$ is 3 V to 5 V. By this connection, MOS transistor is turned OFF when supply voltage $V_{DD}$ of 3 V to 5 V is applied to the gate electrode of MOS transistor 51. In particular, by applying a supply voltage $V_{DD}$=3 V to 5 V, a channel is formed under the gate electrode since threshold voltage $V_{TH}$ of MOS transistor 51 is 0.5 V to 1.0 V. However, since high resistance region (R) exists at the side of the source region, current does not flow from the drain region to the source region. Accordingly, MOS transistor 51 is turned OFF.

Figure 2:
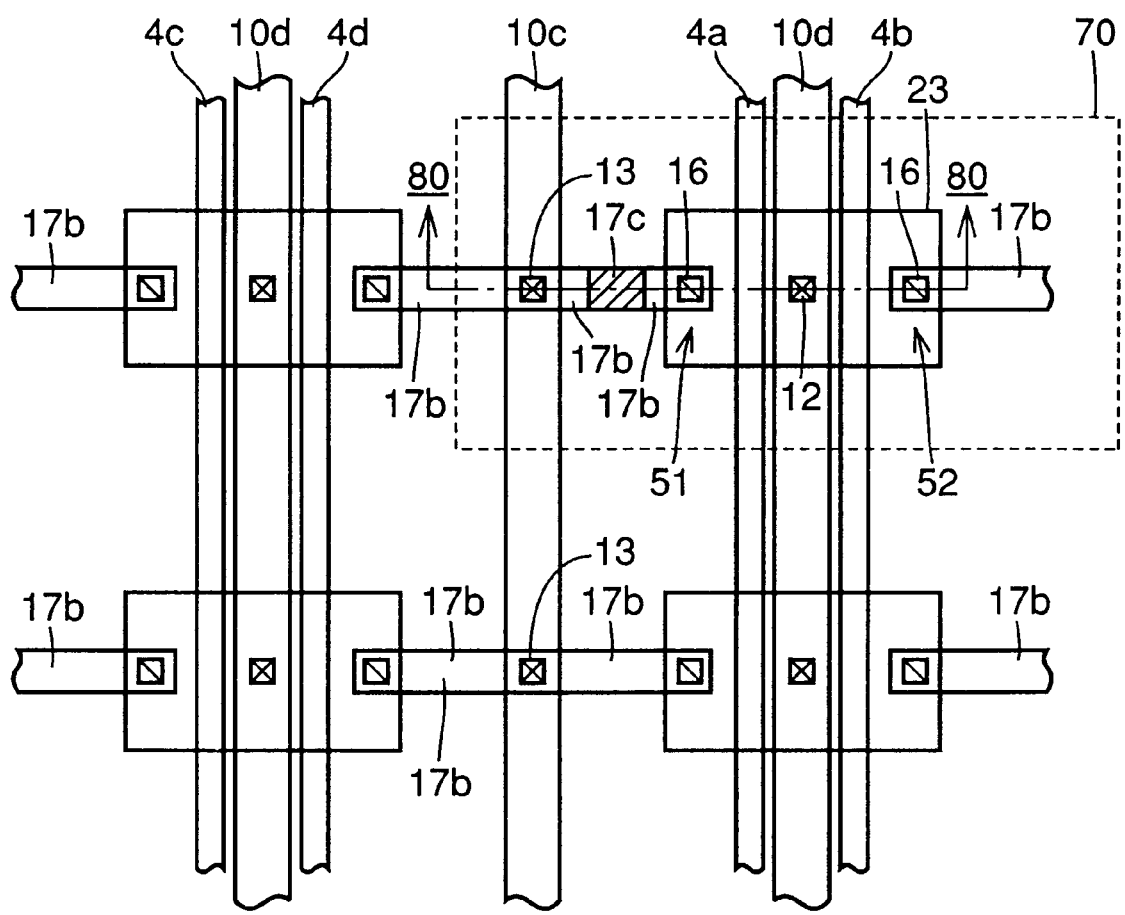
FIG. 2 is a plan view showing the semiconductor memory device including an ROM, in accordance with the first embodiment of the present invention.
Figure 3:
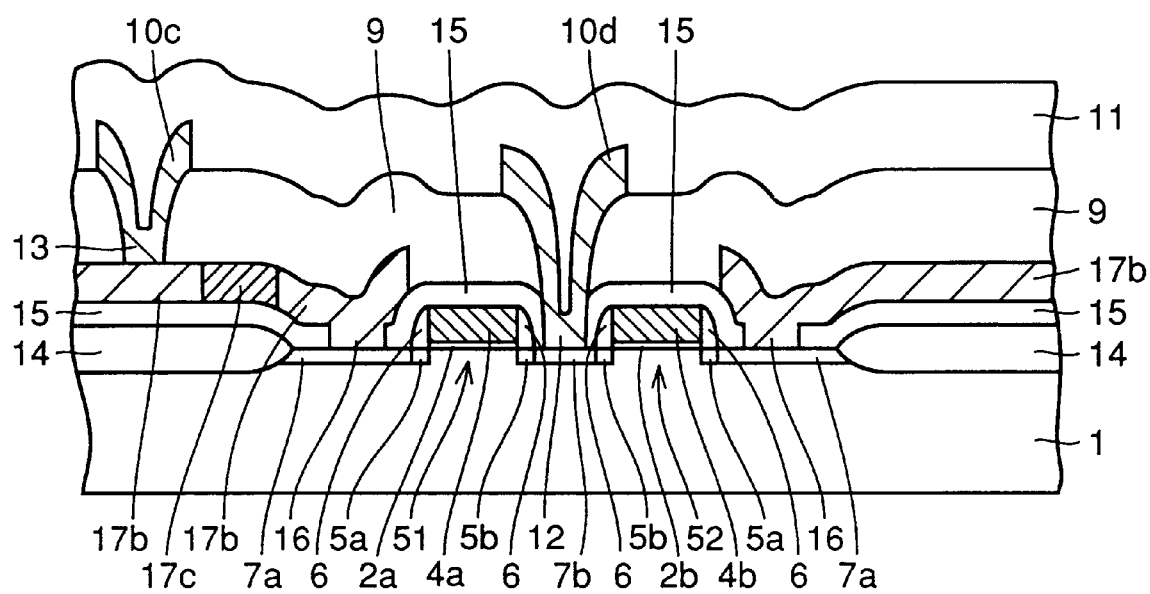
FIG. 3 is a cross sectional view taken along line 80—80 of the semiconductor memory device of the first embodiment shown in FIG. 2.

Referring now to FIGS. 2 and 3, the structure of the semiconductor memory device of the first embodiment will be described. In this first embodiment, a field oxide film 14 for element isolation is formed at a predetermined region on a main surface of a silicon substrate 1. On the region surrounded by field oxide film 14, N type high impurity concentration regions 7a, 7b and 7a are formed, which are spaced apart by predetermined distances. N type low impurity concentration region 5b is formed at end portions of N type high impurity concentration region 7b, adjacent to gate electrodes 4a and 4b. An N type low impurity concentration region 5a is formed at an end portion of N type high impurity concentration region 7a, adjacent to gate electrode 4a. At an end portion of N type high impurity concentration region 7a adjacent to gate electrode 4b, an N type low impurity concentration region 5a is formed.

N type high impurity concentration region 7a and N type low impurity concentration region 5a form source regions of MOS transistors 51 and 52 having an LDD structure. N type high impurity concentration region 7b and N type low impurity concentration regions 5b form a drain region having an LDD structure shared by MOS transistors 51 and 52.

On the channel region of MOS transistor 51, a gate oxide film 2a having a thickness of about 150 Å to about 250 Å is formed. On gate oxide film 2a, gate electrode 4a is formed which has a thickness of about 1000 Å to 3000 Å and consists of doped polycrystalline silicon film. On the channel region of MOS transistor 52, a gate oxide film 2b having a thickness of about 150 Å to about 250 Å is formed. On gate oxide film 2b, gate electrode 4b is formed, which has a thickness of about 1000 Å to about 3000 Å and consists of doped polycrystalline silicon film. Sidewall insulating films 6 are formed on the side surfaces of gate electrodes 4a and 4b.

An interlayer insulating film 15 having a source direct contact hole 16 on N type high impurity concentration region 7a and a drain contact hole 12 on N type high impurity concentration region 7b is formed to cover field oxide film 14 as well as gate electrodes 4a and 4b. Thickness of interlayer insulating film 15 is about 1000 Å to about 2000 Å. A source wiring consisting of a low resistance polycrystalline silicon wiring region 17b and a high resistance polycrystalline silicon wiring region 17c is connected to N type high impurity concentration region 7a which serves as a source region of MOS transistor 51. This source wiring has a generally uniform thickness of about 2000 Å to about 3000 Å. Meanwhile, a source wiring consisting of low resistance polycrystalline silicon wiring region 17b only, is connected to N type high impurity concentration region 7a forming the source region of MOS transistor 52.

Here, in this embodiment, the source wiring including high resistance polycrystalline silicon wiring region 17c is connected to the source side of MOS transistor 51 which is to be turned OFF when supply voltage $V_{DD}$ of 3 V to 5 V is applied to its gate electrode. Thus, high resistance polycrystalline silicon wiring region 17c prevents current from flowing from the drain region to the source region when a voltage of 3 to 5 V is applied to gate electrode 4a of MOS transistor 51. As a result, MOS transistor 51 is turned OFF. Meanwhile, since a source wiring which consists of low resistance polycrystalline silicon wiring region only is connected to source region (5a and 7a) of MOS transistor 52, current is allowed to flow from the drain region (5b and 7b) to source region (5a and 7a) when a voltage of 3 to 5 V is applied to gate electrode 4b. As a result, MOS transistor 52 is turned ON.

An interlayer insulating film 9 consisting of BPSG (Boro-Phospo Silicate Glass) or PSG (Phospho Silicate Glass) film and having a thickness of about 10000 Å is formed to cover interlayer insulating film 15, low resistance polycrystalline silicon wiring region 17b, and high resistance polycrystalline silicon wiring region 17c. An aluminum wiring 10c for sources and aluminum wiring 10d for drains are formed in interlayer insulating film 9 on low resistance polycrystalline silicon wiring region 17b and N type high impurity concentration region 7b, respectively. Aluminum wiring 10c for sources and aluminum wiring 10d for drains have thickness of about 7000 Å to about 10000 Å. A passivation film 11 consisting of plasma silicon nitride film having a thickness of about 7000 Å to about 8000 Å is formed to cover interlayer insulating film 9, aluminum wiring 10c for sources, and aluminum wiring 10d for drains.

As described above, data is written into ROM in this embodiment by forming high resistance polycrystalline silicon wiring region 17c. Accordingly, writing of data (formation of high resistance polycrystalline silicon wiring region 17c) can be performed in a later step of the manufacturing process than in the conventional process where data is written by forming high concentration channel doped region 108 in the channel region. Thus, the process from the step of writing data to the completion of the semiconductor memory device is reduced, compared to the conventional example.

Referring to FIGS. 4 to 17, the process of manufacturing the semiconductor device of the first embodiment will be described.

Figure 4:
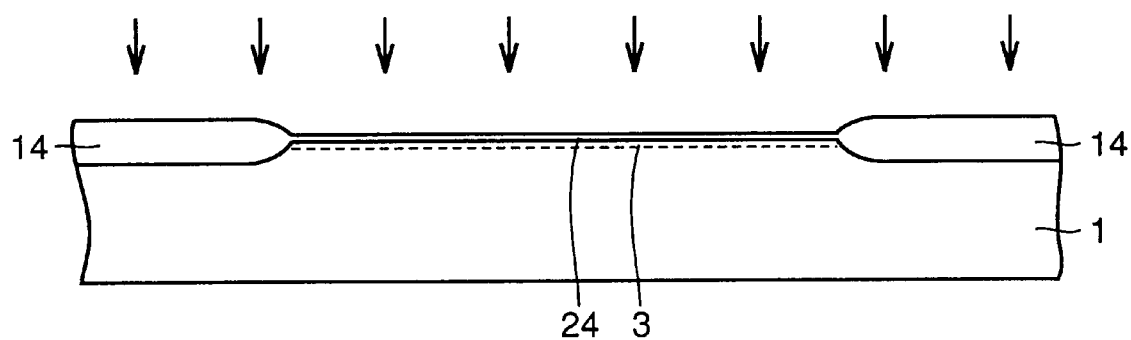
FIGS. 4 to 17 are cross sectional views illustrating the first to fourteenth steps in the process of manufacturing the semiconductor memory device of the first embodiment shown in FIG. 3.

First, as shown in FIG. 4, an oxide film 24 having a thickness of about 100 Å to 500 Å is formed on the surface of silicon substrate 1. Also, a field oxide film 14 for element isolation is formed at a predetermined region on the surface of silicon substrate 1, using LOCOS (LOCal Oxidation of Silicon) method. Then, by performing an ion implantation of B or $BF_2$ to silicon substrate 1, a channel doped layer 3 is formed. This ion implantation is performed with implanting energy of 40 to 60 KeV and impurity concentration of $1 \times 10^{12}$ to $5 \times 10^{12}$ cm$^{-2}$. This formation of channel doped region 3 is performed so as to set the threshold voltage $V_{TH}$ of the MOS transistor at 0.5 to 1.0 V.

Figure 5:
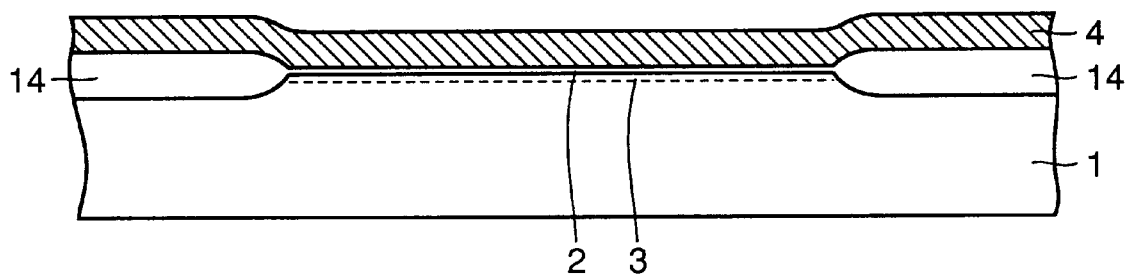
Figure 6:
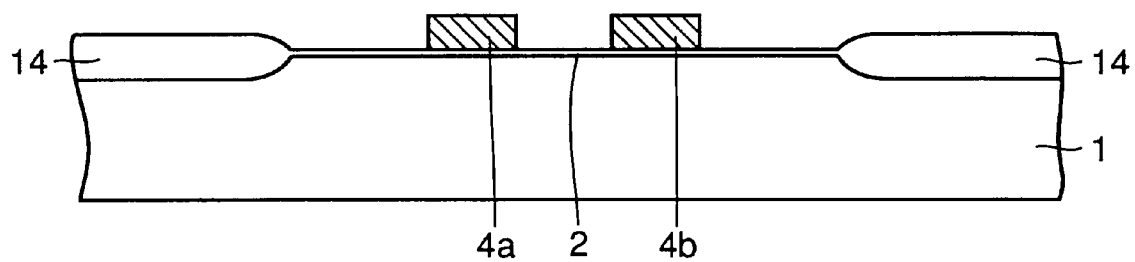

Then, after removing oxide film 24, a gate oxide layer 2 having a thickness of about 150 Å to about 250 Å is formed, as shown in FIG. 5. A doped polycrystalline silicon film 4 with a thickness of about 1000 Å to 3000 Å is formed by CVD method on gate oxide film 2 and on field oxide film 14. By photolithography and dry etching, doped polycrystalline silicon film 4 is patterned to form gate electrodes (wirings) 4a and 4b as shown in FIG. 6.

Figure 7:
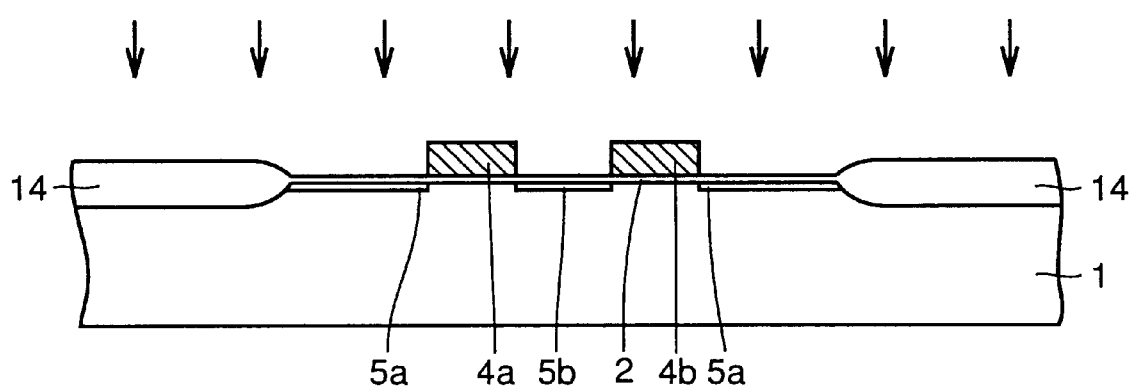

Thereafter, as shown in FIG. 7, ion implantation of phosphorus (P) is performed to silicon substrate 1, using gate electrodes 4a and 4b as a mask. This ion implantation is performed with implanting energy of 30 KeV to 50 KeV, and impurity concentration of 3 to $6 \times 10^{13}$ cm$^{-2}$. Thus, N type low impurity concentration regions 5a and 5b are formed.

Figure 8:
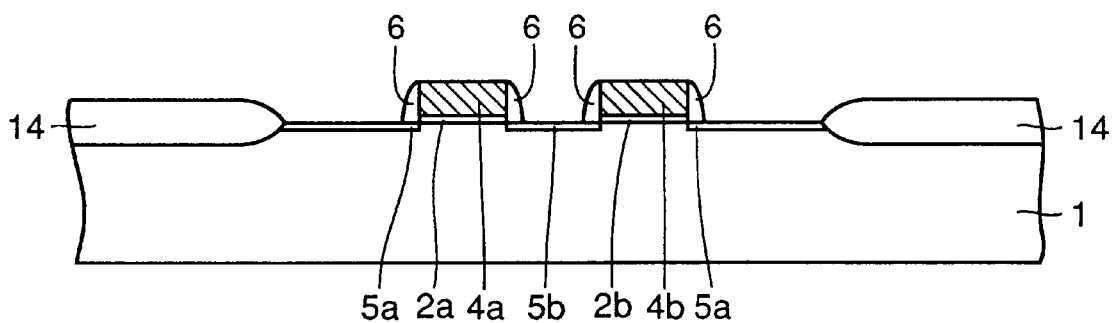

Then, an oxide film (not shown) is formed entirely over the surface to a thickness of about 2000 Å to about 3000 Å, and then is etched anisotropically to form sidewall insulating films 6 as shown in FIG. 8. At the same time, gate oxide film 2a and 2b are also formed.

Figure 9:
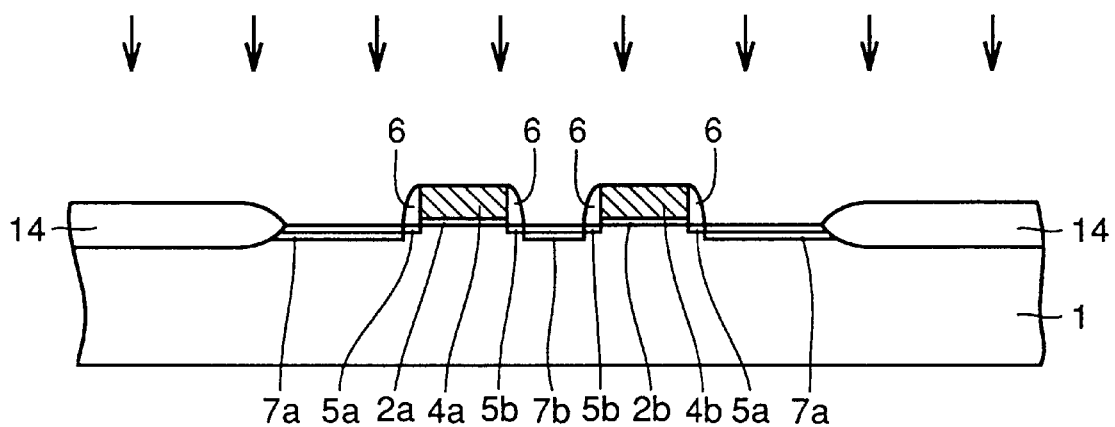
Figure 10:
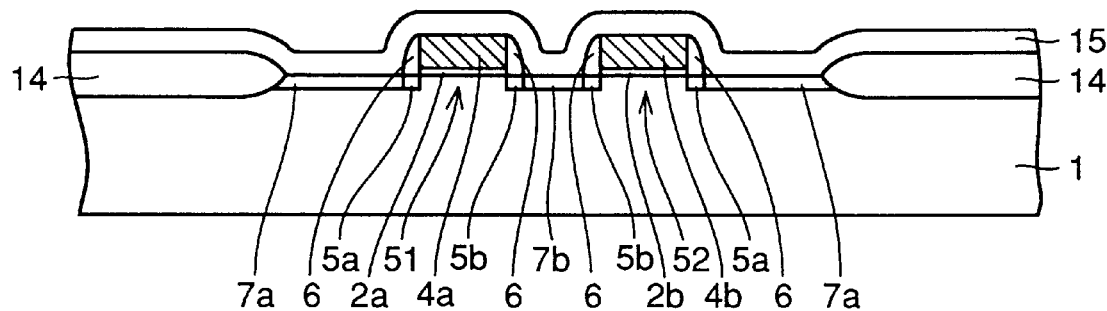

Then, using gate electrode 4a, sidewall insulating films 6 and field oxide film 14 as a mask, ion implantation of arsenic is effected to silicon substrate 1 as shown in FIG. 9. This ion implantation is performed with implanting energy of 30 KeV to 50 KeV and impurity concentration of 3–6×10$^{15}$ cm$^{-2}$. Thus, N type high impurity concentration regions 7a and 7b are formed. Then, by heat treatment, impurity in N type high impurity concentration region 7a, 7b and N type low impurity concentration region 5a, 5b is activated. As a result, N type high impurity concentration regions 7a, 7b and N type low impurity concentration regions 5a, 5b having such shapes as shown in FIG. 10 is obtained. Then, the lower interlayer insulating film 15 is formed by CVD method so as to cover the entire surface, with a thickness of about 1000 Å to about 2000 Å.

Figure 11:
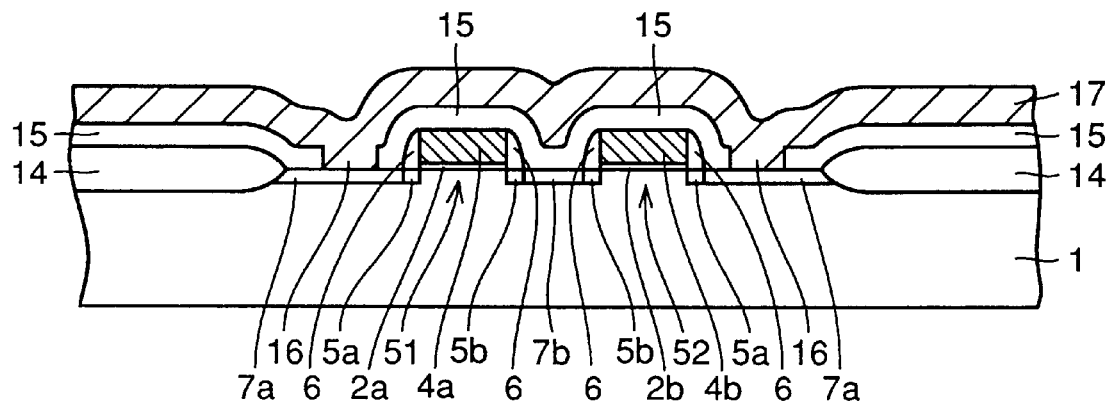

Then, as shown in FIG. 11, source direct contact holes 16 are formed at the regions of interlayer insulating film 15 on N type high impurity concentration regions 7a, using photolithography and dry etching. A non-doped polycrystalline silicon layer 17 is formed by CVD method then, to cover the surface entirely, which layer 17 having a thickness of about 2000 Å to about 3000 Å. Alternatively, an amorphous silicon layer may be formed instead of non-doped polycrystalline silicon layer 17.

Figure 12:
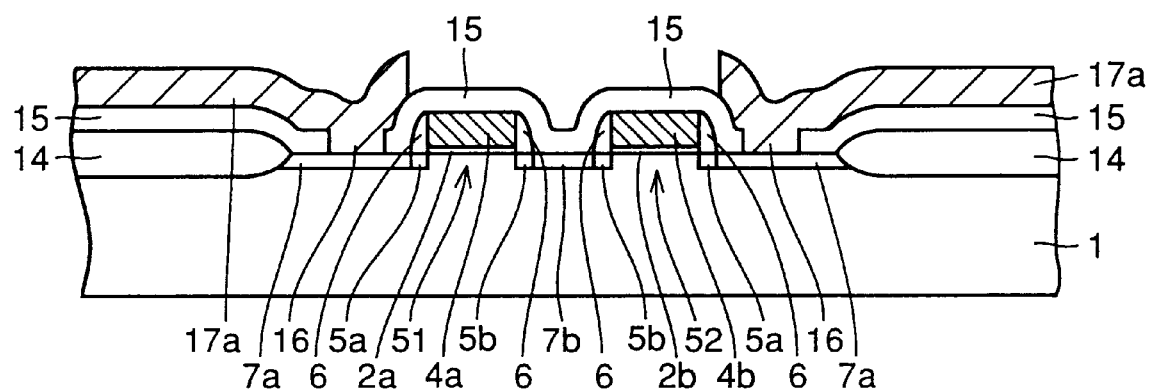

Photolithography and dry etching is then used to pattern non-doped polycrystalline silicon layer 17 thereby forming a non-doped polycrystalline silicon wiring layer 17a as shown in FIG. 12.

Figure 13:
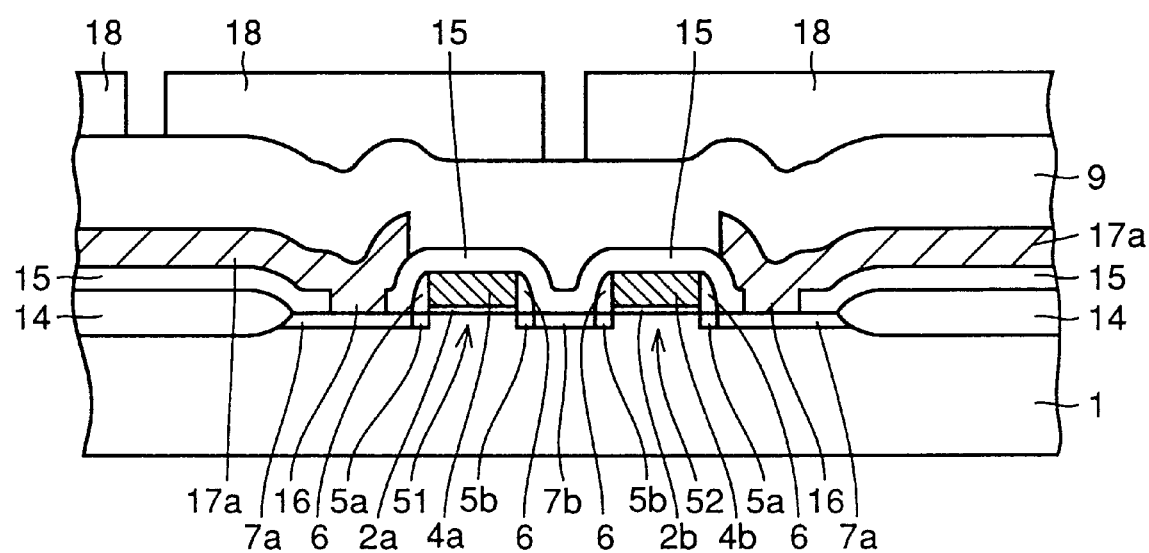
Figure 14:
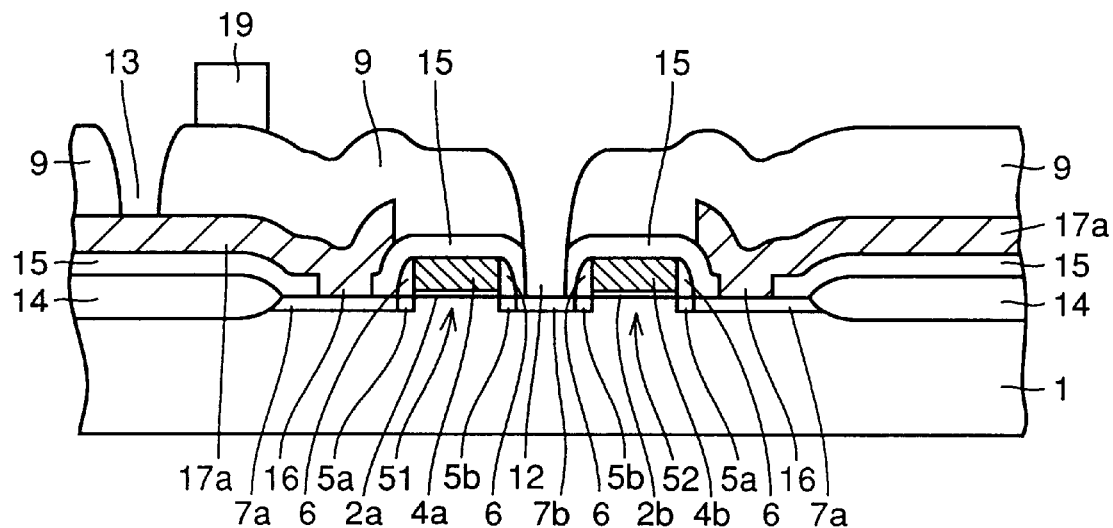

As shown in FIG. 13, interlayer insulating film 9 consisting of BPSG or PSG film with a thickness of about 10000 Å is formed by CVD method to cover the surface entirely. On predetermined regions of interlayer insulating film 9, resist pattern 18 is formed. Using resist pattern 18 as a mask, interlayer insulating film 9 is etched isotropically first; then it is etched anisotropically. Resist pattern 18 is removed, and heat treatment is effected, which forms a drain contact hole 12 and a source contact hole 13 having such shapes as shown in FIG. 14.

Figure 15:
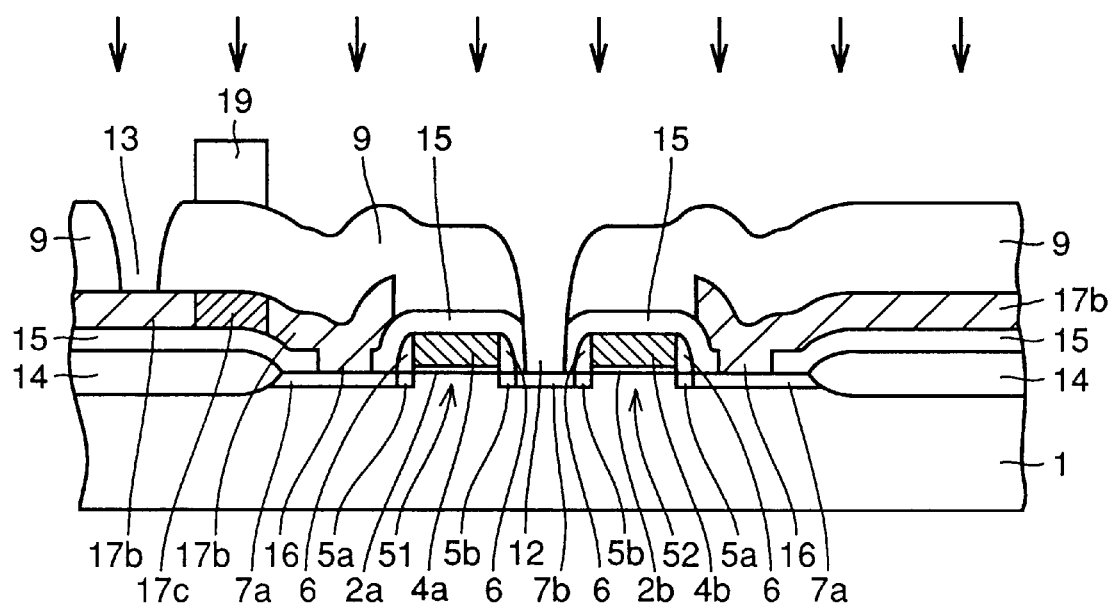

Resist pattern 19 is then formed on interlayer insulating film 9 positioned above non-doped polycrystalline silicon wiring layer 17a which is connected to source region (7a, 5a) of MOS transistor 51. Using resist pattern 19 as a mask, ion implantation of phosphorus (P) is performed on non-doped polycrystalline silicon wiring layer 17a through interlayer insulating film 9. This ion implantation is performed with implanting energy of 200 KeV to 300 KeV and an impurity concentration of $1 \times 10^{14}$ to $1 \times 10^{15}$ cm$^{-2}$. Thus, the source wiring of MOS transistor 51 consisting of low resistance polycrystalline silicon wiring region 17b and high resistance polycrystalline silicon wiring region 17c as well as the source wiring of MOS transistor 52 consisting of low resistance polycrystalline silicon wiring region 17b only are formed, as shown in FIG. 15. Although phosphorus is also implanted into N type high impurity concentration region 7b when this ion implantation is performed, it does not cause any problem because phosphorus is an N type impurity.

Thus, in the manufacturing method of semiconductor memory device of this first embodiment, writing into ROM (formation of high resistance polycrystalline silicon wiring region 17c) can be performed after drain contact hole 12 and source contact hole 13 are formed. As a result, the number of process steps is reduced between the step of writing into the ROM and the completion of the semiconductor memory device, compared to the conventional example where the writing into the ROM has been done by forming high impurity concentration region 108 at the channel region. In particular, the step of writing into the ROM (formation of high resistance polycrystalline silicon wiring region 17c) shown in FIG. 15 is followed by steps of forming the aluminum wiring and forming the passivation film only, in order to complete the semiconductor memory device. As a result, the semiconductor memory device can be completed in shorter time compared to the conventional example, after it was ordered by the user.

Figure 16:
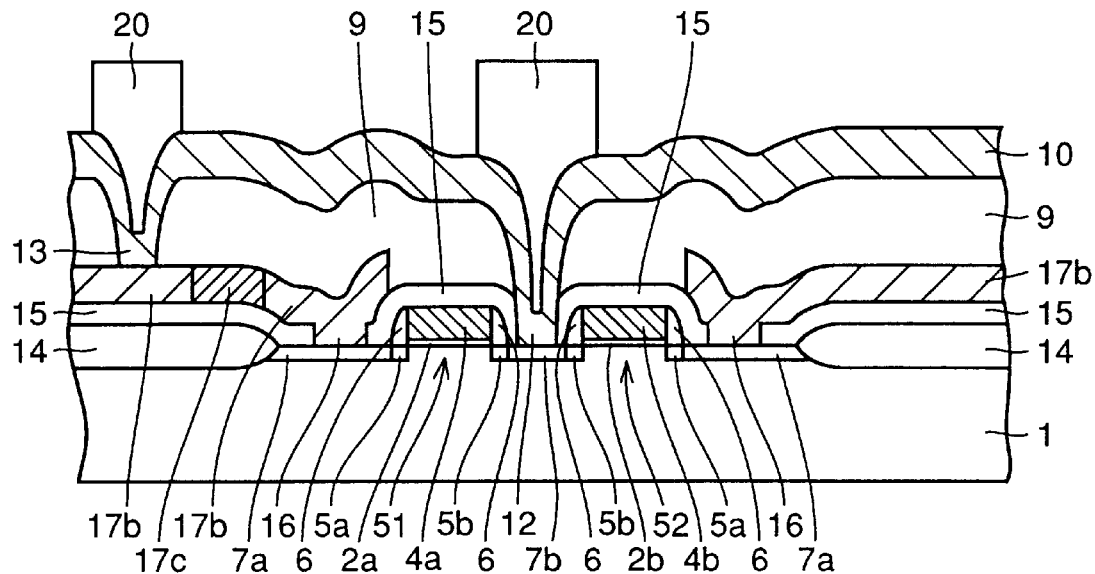
Figure 17:
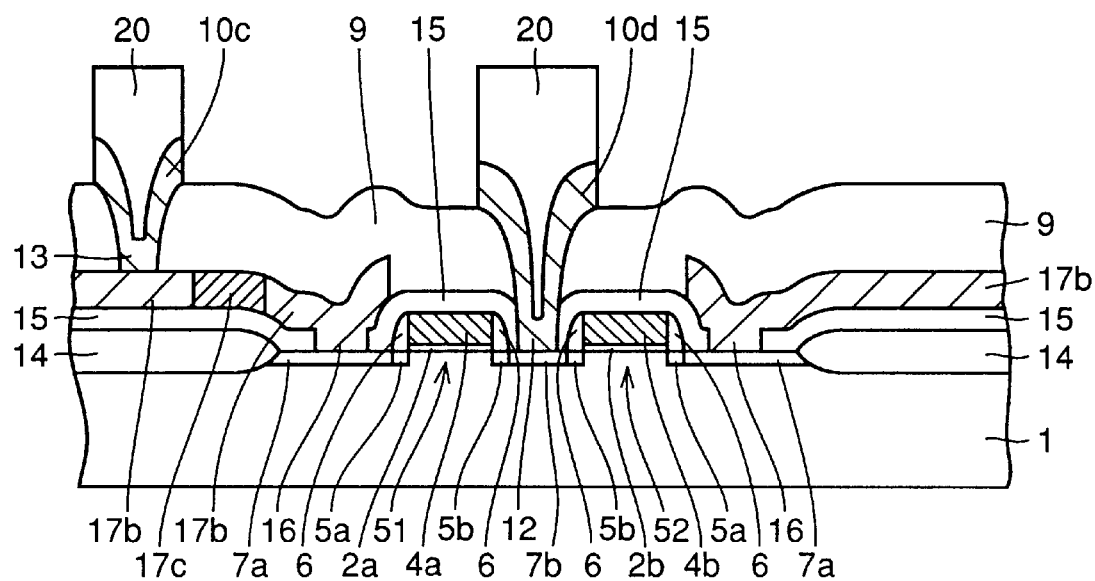

After the step of ion implantation shown in FIG. 15, resist pattern 19 is removed. Then, as shown in FIG. 16, an aluminum wiring layer 10 is formed entirely over the surface by sputtering method to have a thickness of about 7000 Å to about 10000 Å. At predetermined regions on aluminum wiring layer 10, a resist pattern 20 is formed by photolithography. Using resist pattern 20 as a mask, aluminum wiring layer 10 is etched anisotropically, thereby forming aluminum wiring 10c for sources and aluminum wiring 10d for drains, as shown in FIG. 17. Resist pattern 20 is then removed.

Finally, as shown in FIG. 3, passivation film 11 of plasma nitride film is formed by CVD method to a thickness of about 7000 Å to about 8000 Å. In this way, the semiconductor memory device of the first embodiment is completed.

Figure 18:
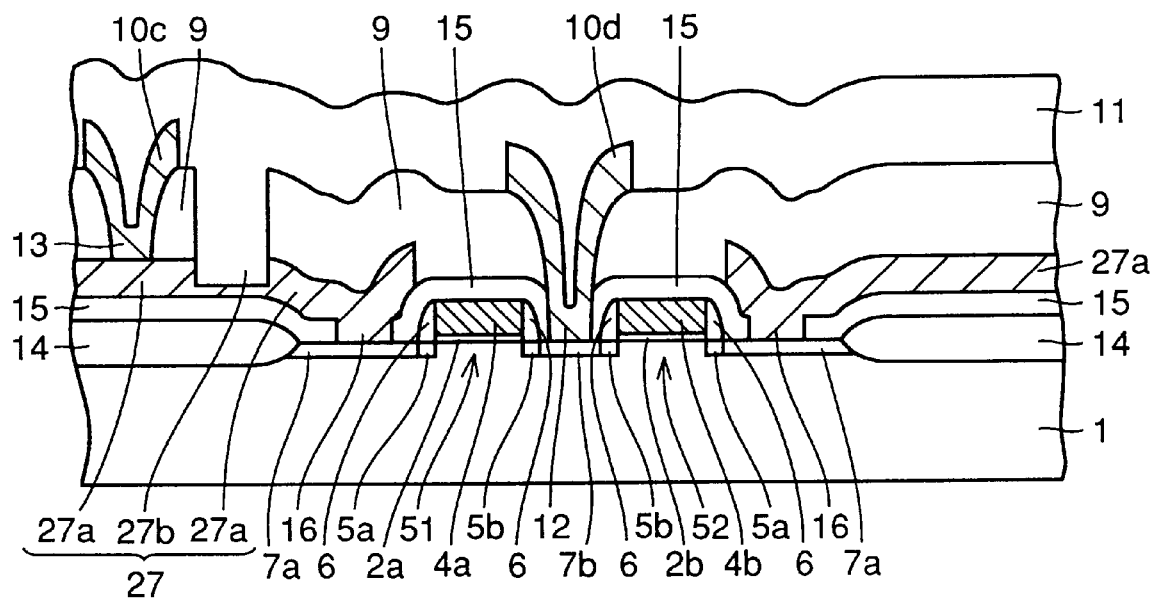
FIG. 18 is a cross sectional view showing a semiconductor memory device including an ROM, in accordance with the second embodiment of the present invention.

Referring to FIG. 18, a semiconductor memory device of a second embodiment is different from the first embodiment of FIG. 3 in that a low resistance polycrystalline silicon wiring region 27a and a high resistance polycrystalline silicon wiring region 27b are formed by changing the film thickness of a doped polycrystalline silicon film which forms a source wiring 27. In other words, high resistance polycrystalline silicon wiring region 27b can be formed easily by reducing the thickness of a portion of doped polycrystalline silicon layer with uniform impurity concentration. This step of forming high resistance polycrystalline silicon wiring region 27b of the second embodiment can be performed after an aluminum wiring 10c for sources and an aluminum wiring 10d for drains are formed, as will be described later. As a result, the number of manufacturing process steps can be further reduced between the steps of writing into the ROM (forming high resistance polycrystalline silicon wiring region 27b) and completing the semiconductor memory device, compared to the first embodiment.

Figure 19:
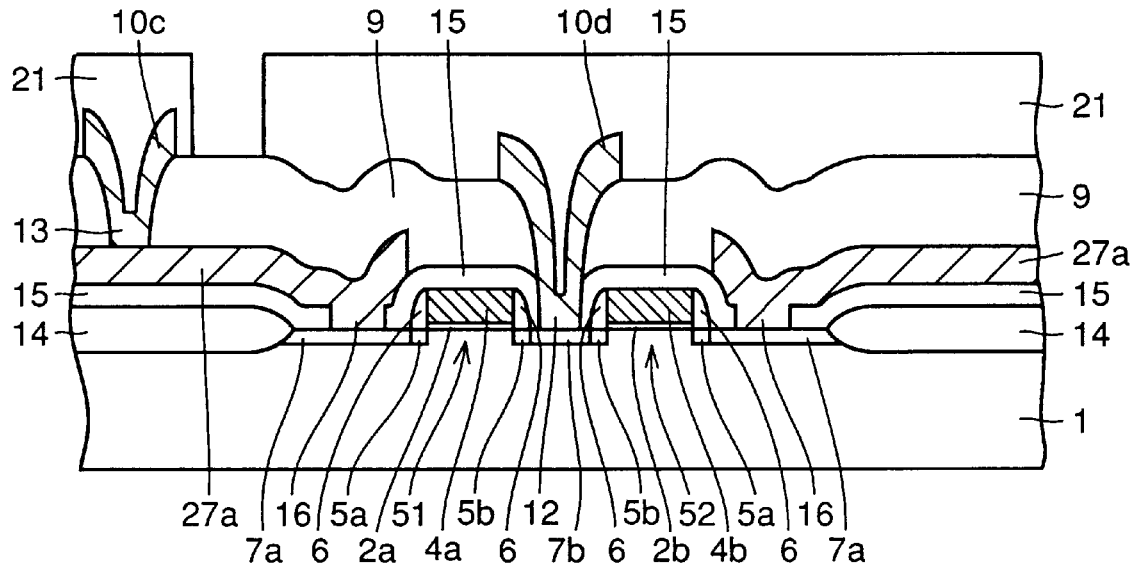
FIGS. 19 and 20 are cross sectional views illustrating the first and second steps in the process of manufacturing the semiconductor device of the second embodiment shown in FIG. 18.
Figure 20:
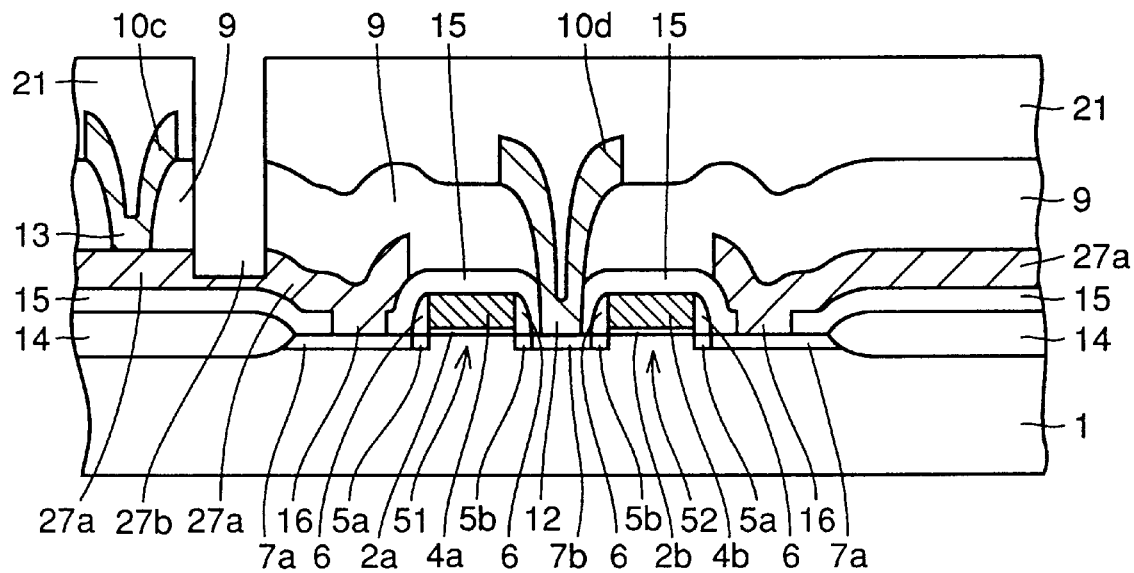

Referring to FIGS. 19 and 20, manufacturing process of a semiconductor memory device according to the second embodiment is as follows. A process similar to that of the manufacturing process of a semiconductor memory device shown in FIGS. 1 to 14, is carried on until a drain contact hole 12 and a source contact hole 13 are formed. At this time, when forming source wiring by a process similar to that of FIGS. 11 and 12, a doped polycrystalline silicon film which consists of low resistance polycrystalline silicon wiring region 27a only is formed, in this second embodiment.

Also, after forming drain contact hole 12 and source contact hole 13, aluminum wiring 10c for sources and aluminum wiring 10d for drains are formed by a process similar to the manufacturing process of semiconductor memory device according to the first embodiment, which was shown in FIGS. 16 and 17. Then, a resist pattern 21 is formed on interlayer insulating film 9, aluminum wiring 10c for sources, and aluminum wiring 10d for drains. This resist pattern 21 is used as a mask to etch interlayer insulating film 9 anisotropically, and to perform a further anisotropical etching on doped polycrystalline silicon film consisting of low resistance polycrystalline silicon wiring region 27a only. This forms low resistance polycrystalline silicon wiring region 27a and high resistance polycrystalline wiring region 27b as shown in FIG. 20. This means that high resistance polycrystalline wiring region 27b is formed easily by making the thickness of a portion of doped polycrystalline silicon film thinner. Writing into the ROM (formation of high resistance polycrystalline silicon wiring region 27b) is thus performed, and resist pattern 21 is removed thereafter.

Finally, as shown in FIG. 18, a passivation film 11 is formed by CVD method. Thus, the semiconductor memory device of the second embodiment is completed. As already described, formation of high resistance polycrystalline silicon wiring region 27c (writing into the ROM) is performed after aluminum wiring 10c for sources and aluminum wiring 10d for drains are formed, so that the semiconductor memory device is completed by simply forming passivation film 11 after that step of writing into the ROM. In this way, the number of process steps is reduced between the step of writing the ROM and the completion of the semiconductor device, compared to the first embodiment.

Figure 21:
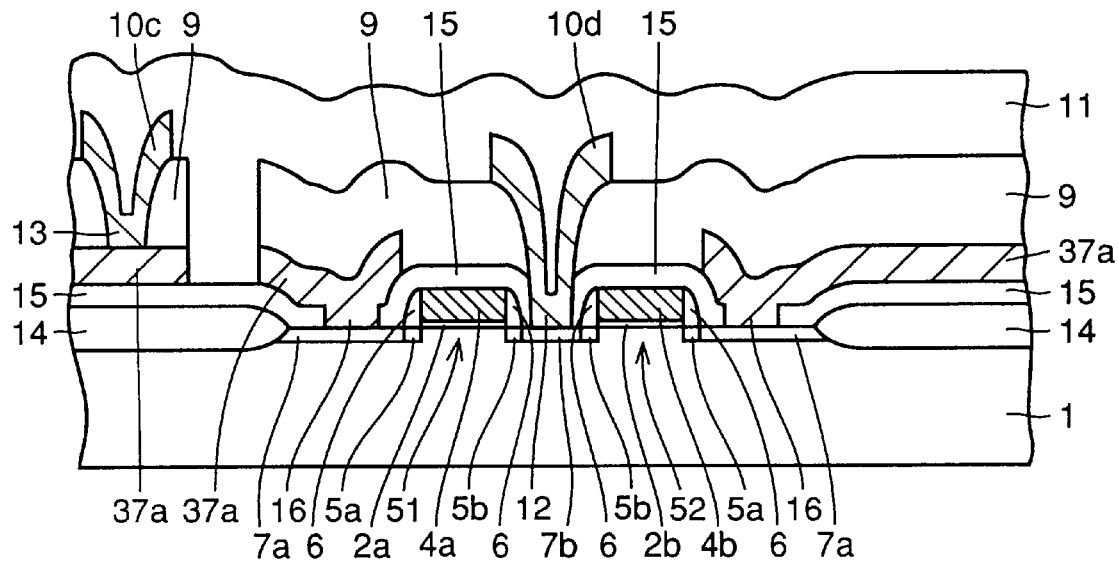
FIG. 21 is a cross sectional view showing a semiconductor memory device including an ROM, in accordance with the third embodiment of the present invention.

Referring to FIG. 21, in a semiconductor memory device according to a third embodiment, source wiring 37a is disconnected instead of providing a high resistance region at source wiring 37a of an MOS transistor 51. By disconnecting source wiring 37a in this way, it is possible to turn transistor 51 OFF when a voltage of 3 V to 5 V is applied to MOS transistor 51, as in the first and second embodiments. Also, source wiring 37a is not limited to a polycrystalline silicon wiring. Refractory metal wiring or refractory metal silicide wiring may also be used.

Figure 22:
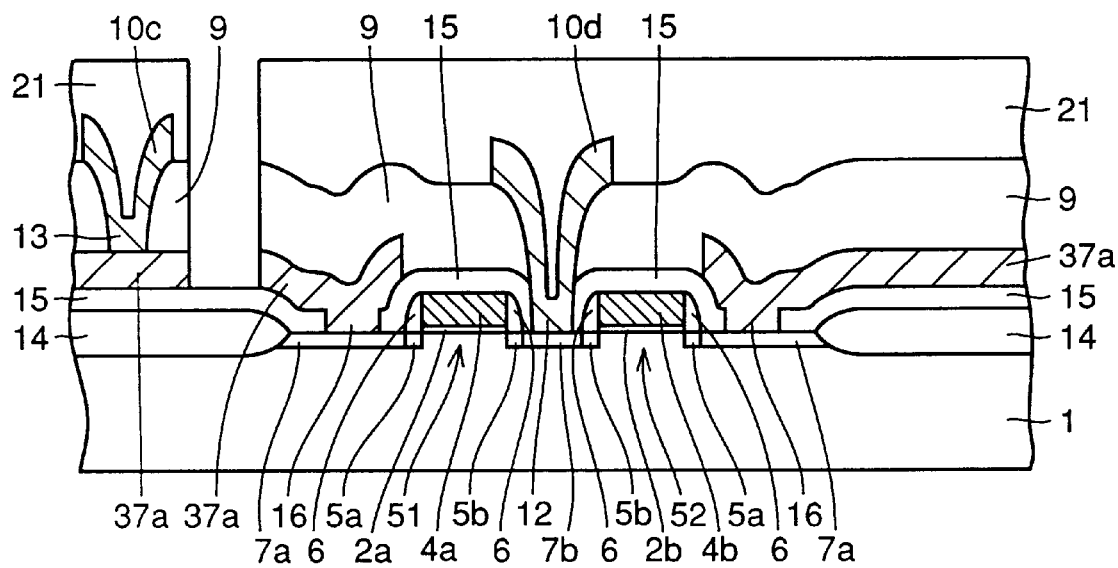
FIG. 22 is a cross sectional view illustrating the process of manufacturing the semiconductor memory device of the third embodiment shown in FIG. 21.

Referring to FIG. 22, in a manufacturing process of this semiconductor memory device according to the third embodiment, the same process as in manufacturing the semiconductor memory device of the second embodiment shown in FIG. 20 is performed except that all source wiring 37a is subjected to etching, using a resist pattern 21 as a mask. As a result, source wiring 37a can be disconnected easily. In addition, the disconnection of source wiring 37a by etching is performed above a field oxide film 14 and an interlayer insulating film 15 with considerable film thicknesses so that there is no problem even if source wiring 37a is overetched. Resist pattern 21 is then removed. Thereafter, a passivation film 11 as shown in FIG. 21 is formed, by means of CVD method.

In the manufacturing process of the semiconductor memory device according to this third embodiment, writing into the ROM (cutting the source wirings 37a) is also performed after an aluminum wiring 10c for sources and an aluminum wiring 10d for drains are formed, so that the semiconductor memory device can be formed by simply forming passivation film 11 after the writing into the ROM is effected. Thus, the number of process steps can be further reduced between the step of writing into the ROM and completion of the semiconductor memory device.

Figure 23:
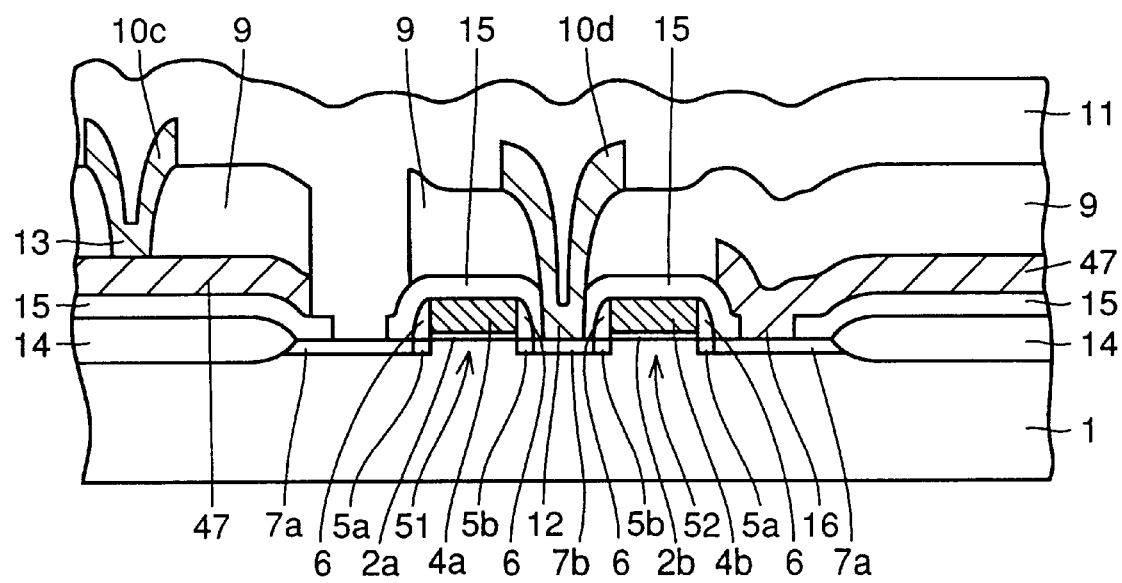
FIG. 23 is a cross sectional view showing a semiconductor memory device including a ROM in accordance with the fourth embodiment of the present invention.
Figure 24:
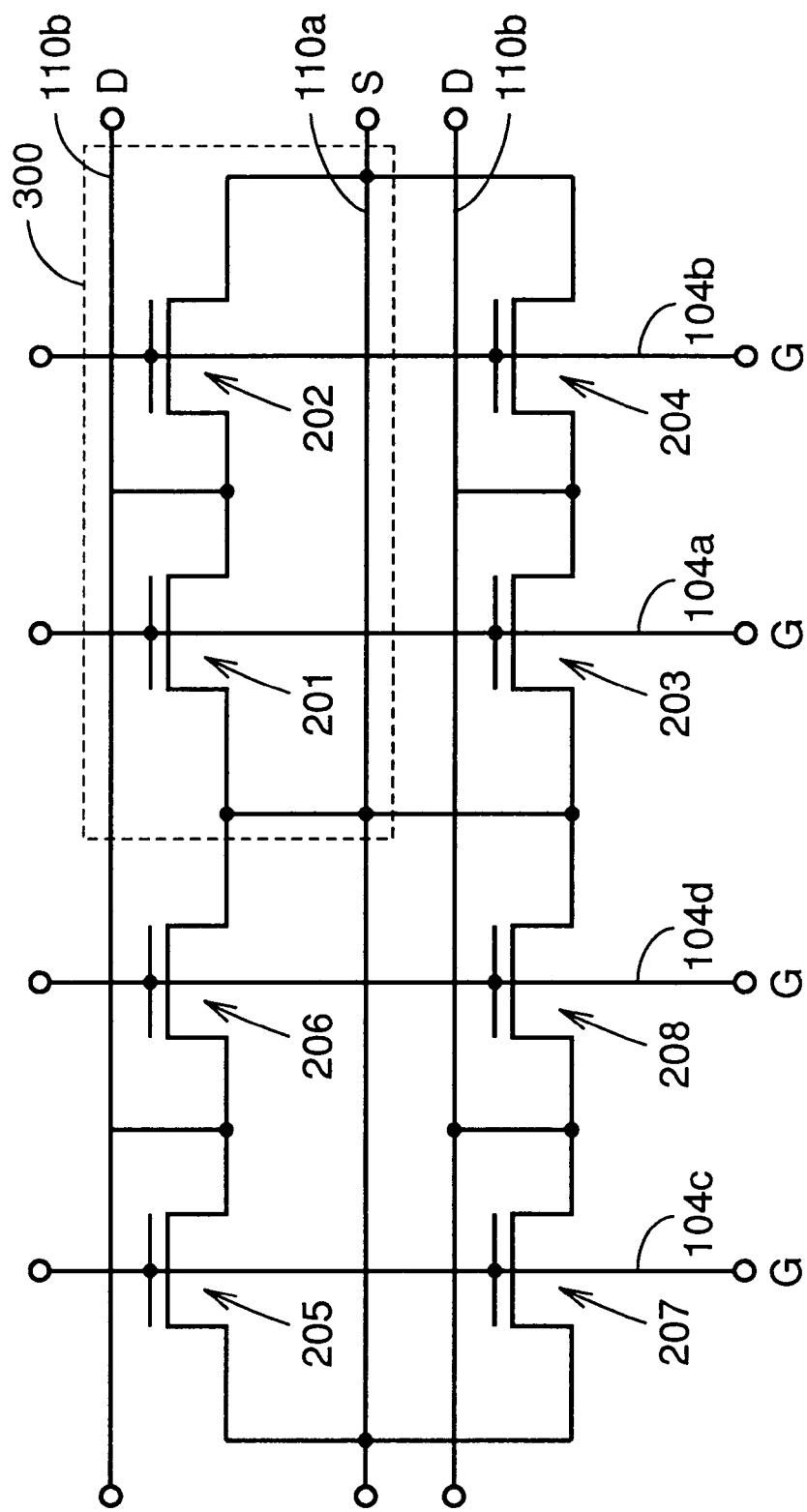
FIG. 24 is an equivalent circuit diagram of a conventional semiconductor memory device including an ROM.
Figure 25:
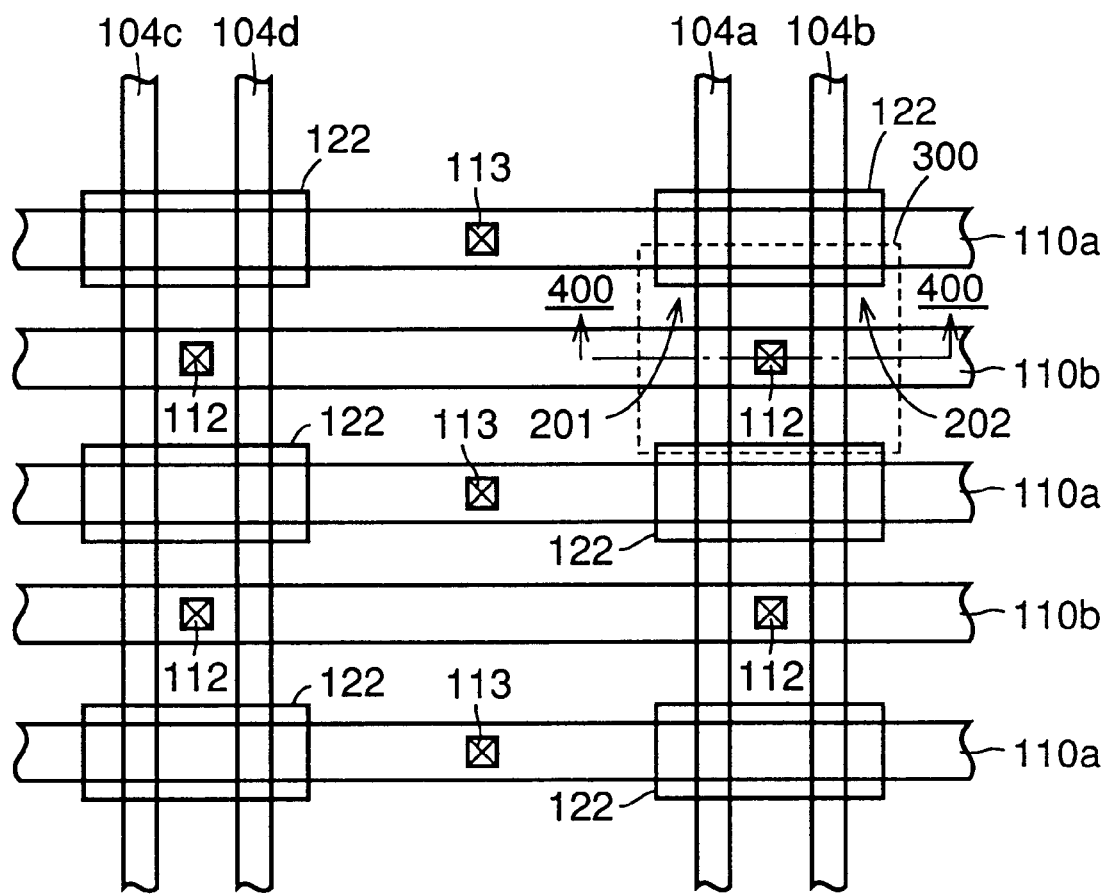
FIG. 25 is a plan view showing the conventional semiconductor memory device including an ROM.
Figure 26:
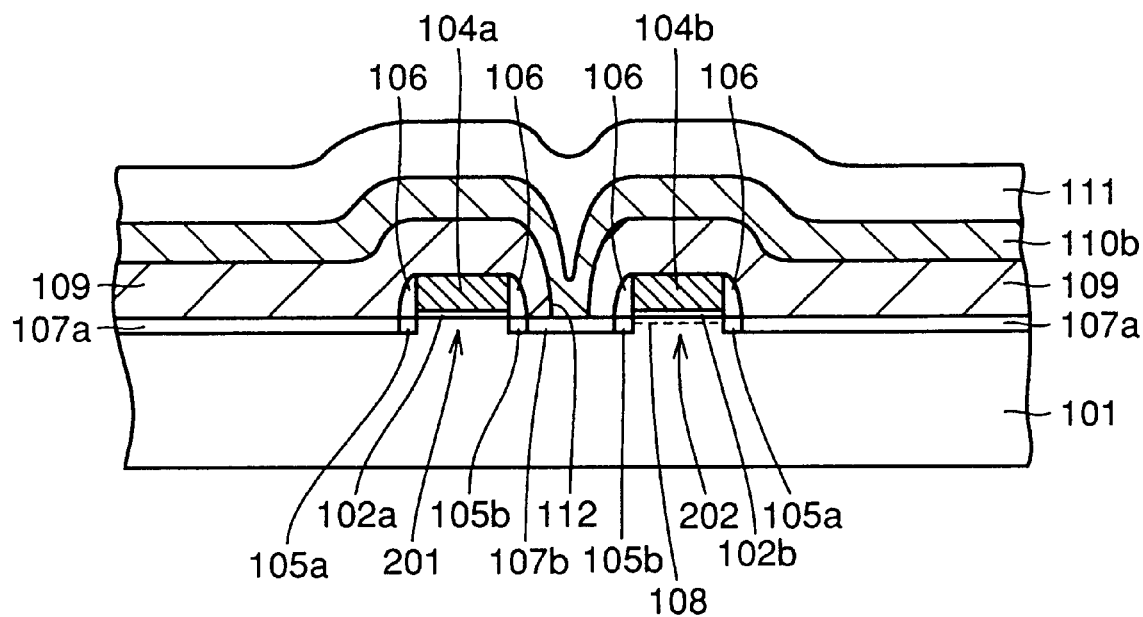
FIG. 26 is a cross sectional view taken along line 400—400 of the conventional semiconductor memory device shown in FIG. 25.
Figure 27:
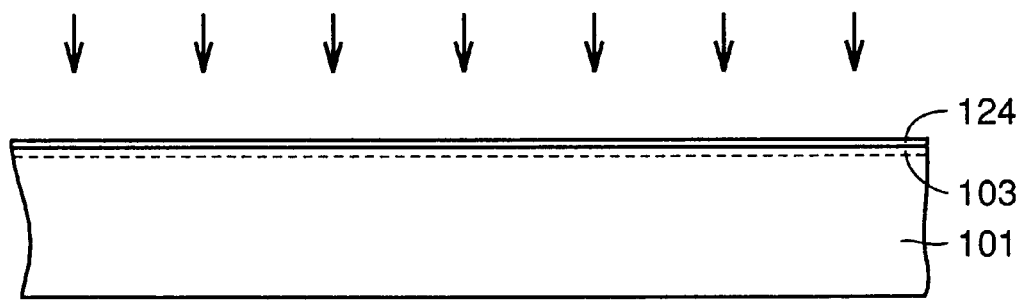
FIGS. 27 to 36 are cross sectional views illustrating the first to tenth steps in the process of manufacturing the semiconductor memory device shown in FIG. 26.
Figure 28:
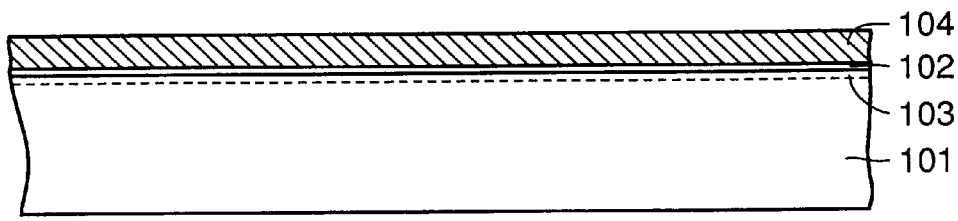
Figure 29:
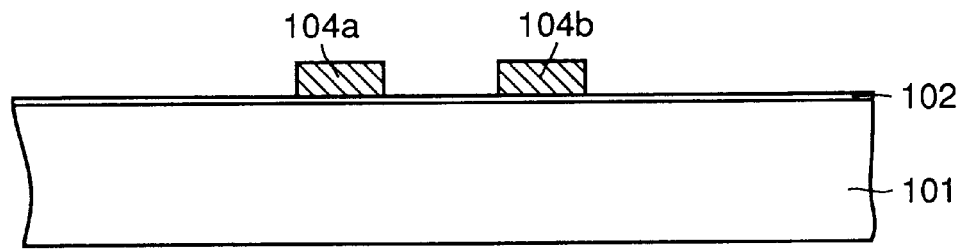
Figure 30:
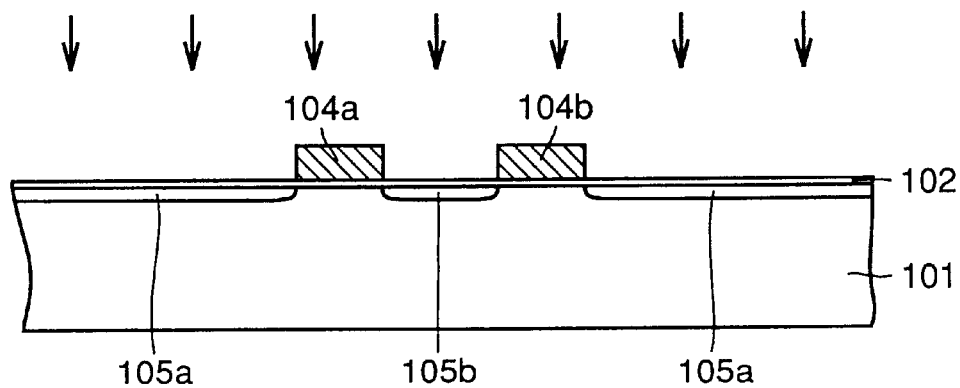
Figure 31:
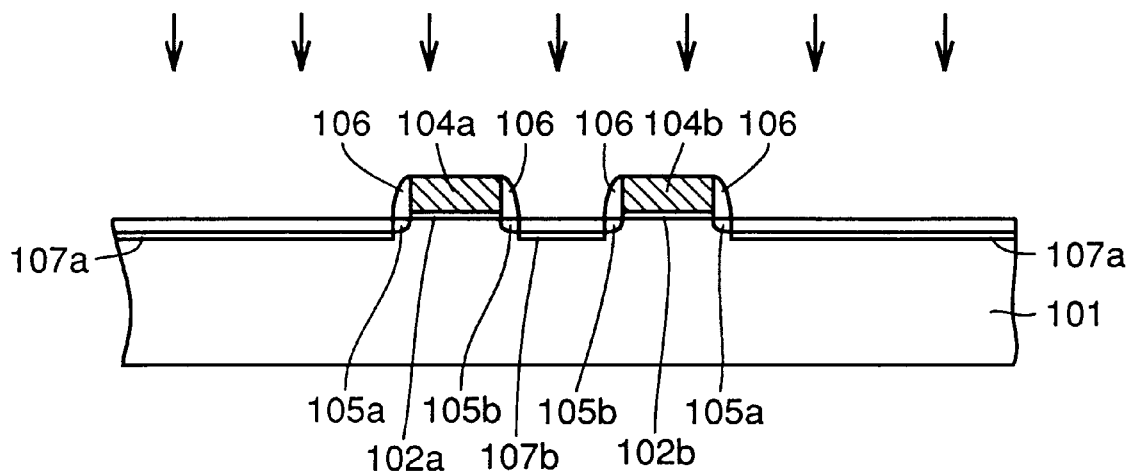
Figure 32:
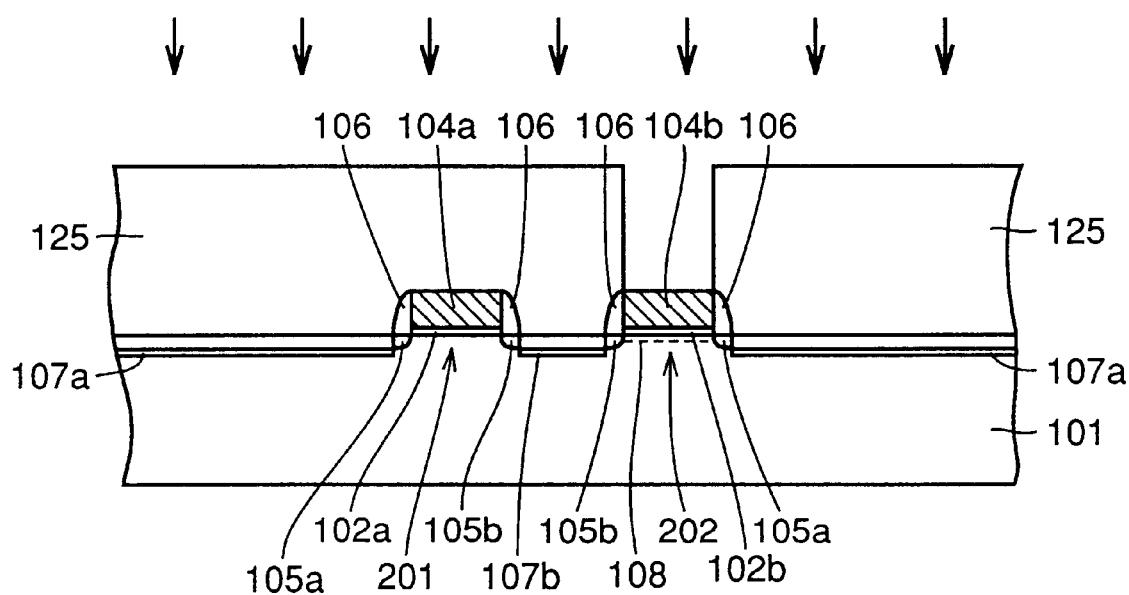
Figure 33:
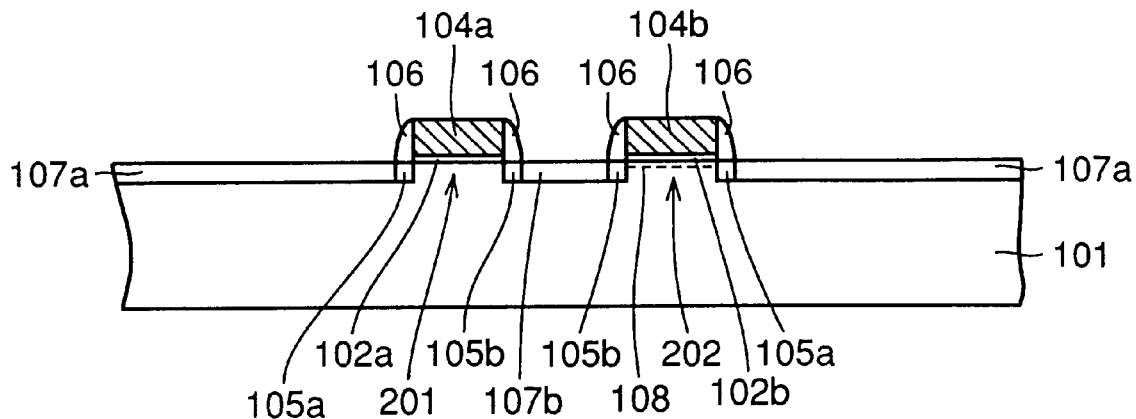
Figure 34:
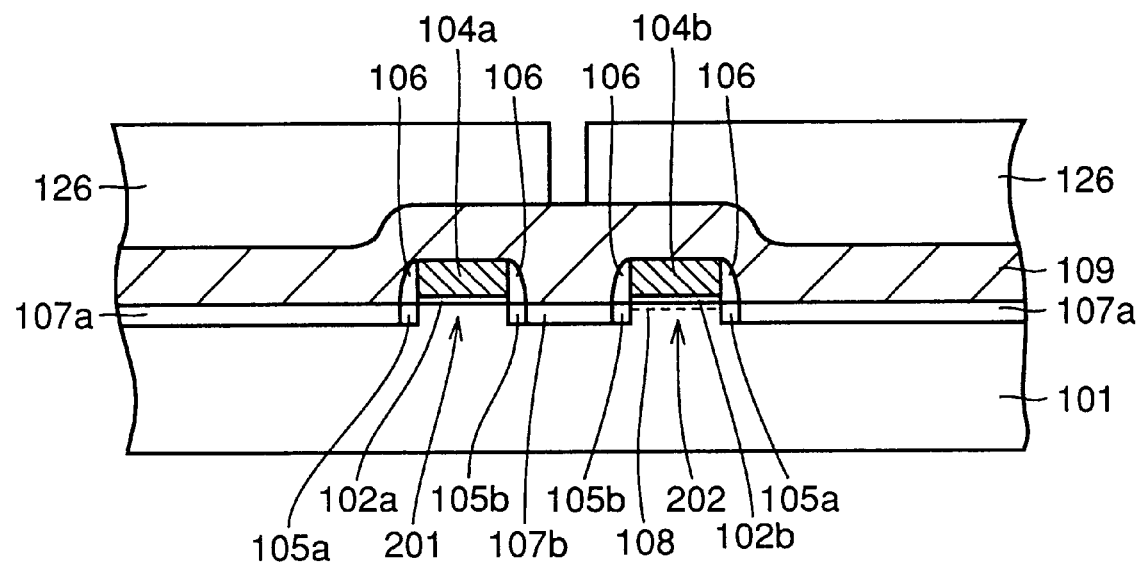
Figure 35:
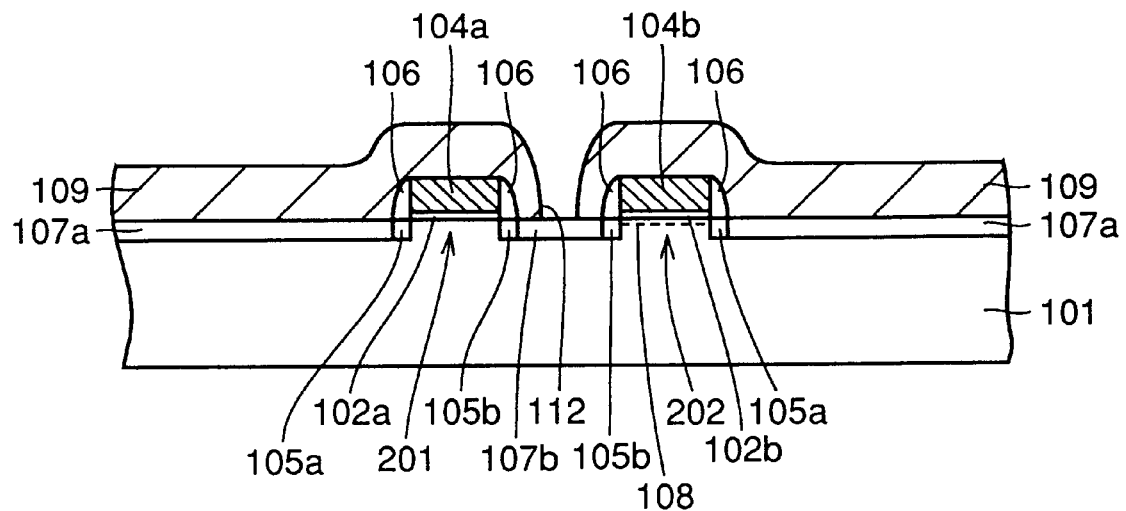
Figure 36:
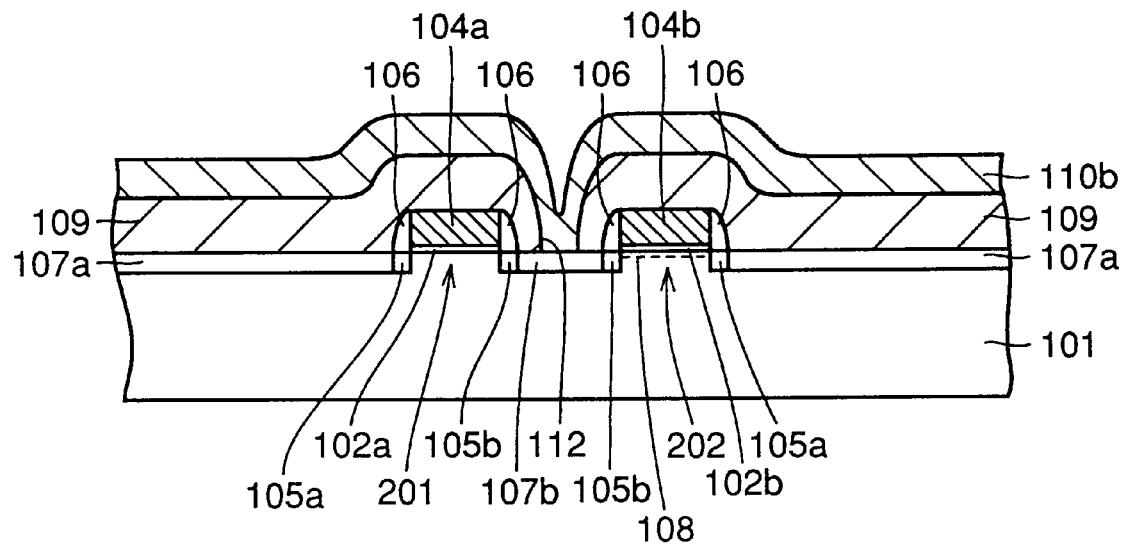

Referring to FIG. 23, in a semiconductor memory device according to a fourth embodiment, a source wiring 47 for an MOS transistor 51 is not connected to source region (5a and 7a) of MOS transistor 51. By not connecting source wiring 47 for MOS transistor 51 to source region (5a and 7a) of the MOS transistor as shown here, an effect which is similar to that of the third embodiment can also be obtained. In other words, when a voltage of 3 V to 5 V is applied to a gate electrode 4a of MOS transistor 51, MOS transistor 51 can be turned OFF. As source wiring 47, not only doped polycrystalline silicon wiring but refractory metal wiring or refractory metal silicide wiring can also be used.

The manufacturing process of this semiconductor memory device according to the fourth embodiment is carried out in the same manner as that of the third embodiment shown in FIG. 22 except that an opening of a resist pattern 21 is formed such that it is located above the source region (5a and 7a) of MOS transistor 51. Then, using that resist pattern as a mask, an interlayer insulating film 9 and source wiring 47 is etched anisotropically. After removing that resist pattern, passivation film 11 is formed so that the semiconductor memory device of the fourth embodiment as shown in FIG. 23 is easily completed.

In this manufacturing process of the semiconductor memory device according to the fourth embodiment, writing into the ROM (the step of removing the portion where source wiring 47 is connected to source region (5a and 7a)) can be performed after an aluminum wiring 10c for sources and an aluminum wiring 10d for drains are formed, so that after the writing into the ROM, the semiconductor memory device can be completed by simply forming a passivation film 11. Thus, the number of process steps between the step of writing into ROM and completing the semiconductor memory device can be further reduced, compared to the first embodiment.

As described above, in a semiconductor memory device according to one aspect of the present invention, a field effect transistor can be turned OFF easily without adjusting its threshold voltage, by connecting a source wiring with a resistor having a high resistance on a portion thereof to a source terminal of the field effect transistor when a voltage of 3 V to 5 V is applied to the field effect transistor. In addition, if a manufacturing process of forming the resistor having a high resistance on the source wiring is performed after a drain contact hole is formed, the number of process steps between the step of writing into the ROM and the completion of the semiconductor memory device can be reduced, compared to the conventional example.

In a semiconductor memory device according to another aspect of the present invention, a field effect transistor can be turned OFF easily without having to control its threshold voltage when a voltage of 3 V to 5 V is applied to a gate electrode of the field effect transistor, by formation of a source wiring layer connected electrically to a source region of a single silicon material so as to include a high resistance region on a portion thereof. In addition, if the manufacturing process for forming a high resistance region on a portion of the source wiring layer after a drain contact hole is formed, the number of process steps between the step of writing into the ROM and the completion of the semiconductor memory device can be reduced, compared to the conventional example.

In a semiconductor memory device according to yet another aspect of the present invention, a field effect transistor can be turned OFF easily when a voltage of 3 V to 5 V is applied to its gate electrode by electrically cutting the connection between a source region and a source wiring layer for the source region. In addition, if the manufacturing steps for electrically cutting the connection between the source wiring layer and a source region is performed after the formation of aluminum wiring for drains and aluminum wiring for sources, the number of process steps can be further reduced between the step of writing into the ROM and completion of the semiconductor memory device.

In a method of manufacturing a semiconductor memory device according to another aspect of the present invention, an interlayer insulating film is formed to cover a source wiring layer. An opening is formed at a region positioned above a drain region of the interlayer insulating film. Then, ion implantation of impurity is performed through the interlayer insulating film to a portion of the source wiring layer to form a high resistance region in the source wiring layer, thereby reducing the number of steps between writing into the ROM (the step of forming the high resistance region) and the completion of the semiconductor memory device, compared to the conventional example.

In a method of manufacturing a semiconductor memory device according to yet another aspect of the present invention, a first opening is formed on a drain region. Then, using an etching mask layer as a mask, an interlayer insulating film and a source wiring layer is subjected to etching, which source wiring layer being etched to a predetermined thickness, thereby forming a high resistance region in a source wiring layer. Thus, after forming the first opening for an aluminum wiring for drains, the step of writing into the ROM (formation of high resistance region) can be performed easily. Accordingly, the number of steps can be further reduced between writing into the ROM and the completion of the semiconductor memory device compared to the conventional example.

In a method of manufacturing a semiconductor memory device according to another aspect of the present invention, a first opening is formed on a drain region. Then, using an etching mask layer as a mask, an interlayer insulating film and a source wiring layer is etched away, disconnecting the source wiring region. Thus, after the formation of the contact hole for an aluminum wiring for drains, writing into the ROM (cutting of the source wiring layer) can be performed easily. As a result, reduction of the number of steps is enabled between the step of writing into the ROM and completion of the semiconductor memory device, compared to the conventional example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device in which a single memory cell consists of a single field effect transistor, wherein said field effect transistor has its source terminal connected to a source wiring having at a portion thereof a resistor with a high resistance.

2. The semiconductor memory device according to claim 1, wherein said field effect transistor is turned OFF when a voltage of 3 V to 5 V is applied thereto.

3. A semiconductor memory device in which a single memory cell consists of a single field effect transistor, comprising:

a semiconductor substrate having a main substrate;

a source region and a drain region formed on the main surface of said semiconductor substrate with a channel region therebetween;

a gate electrode formed on said channel region;

a source wiring layer connected electrically to said source region, wherein said source wiring layer includes a silicon wiring layer having a high resistance portion and an aluminum wiring layer connected to the silicon wiring layer.

4. The semiconductor memory device according to claim 3, wherein thickness of said high resistance region is smaller than that of the source wiring layer other than said high resistance region and a single impurity is introduced in the entire region of the source wiring layer having the high resistance region.

5. The semiconductor memory device according to claim 4, wherein impurity concentration of the high resistance region in said source wiring layer and of regions other than the high resistance region in said source wiring layer is substantially equal.

6. The semiconductor memory device according to claim 3, wherein the impurity concentration of said high resistance region is lower than that of regions other than the high resistance region in said source wiring layer.

7. The semiconductor memory device according to claim 6, wherein thickness of the high resistance region in said source wiring layer and the regions other than the high resistance region in said source wiring layer is substantially equal.

8. The semiconductor memory device according to claim 3, wherein resistance value of said high resistance region is at least 1 Tera $\omega/\square$.

9. A semiconductor memory device in which a single memory cell consists of a single field effect transistor, comprising:

a semiconductor substrate having a main surface;

a source region and a drain region formed on the main surface of said semiconductor substrate with a channel region therebetween;

a gate electrode formed on said channel region;

a source wiring layer for said source region, wherein, said source wiring layer and said source region are electrically disconnected, and said source wiring layer includes a silicon wiring layer having a high resistance portion and an aluminum wiring layer connected to the silicon wiring layer.

10. The semiconductor memory device according to claim 9, wherein a portion of said source wiring layer is mechanically cut off.

11. The semiconductor memory device according to claim 9, wherein an end portion of said source wiring layer at the side of said source region is located on an insulating film instead of being in contact with said source region.

* * * * *